United States Patent
Falster et al.

(10) Patent No.: US 6,930,375 B2
(45) Date of Patent: Aug. 16, 2005

(54) SILICON ON INSULATOR STRUCTURE HAVING AN EPITAXIAL LAYER AND INTRINSIC GETTERING

(75) Inventors: Robert J. Falster, London (GB); Jeffrey L. Libbert, O'Fallon, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 175 days.

(21) Appl. No.: 10/177,444

(22) Filed: Jun. 21, 2002

(65) Prior Publication Data

US 2003/0008435 A1 Jan. 9, 2003

Related U.S. Application Data

(60) Provisional application No. 60/337,623, filed on Dec. 5, 2001, and provisional application No. 60/300,208, filed on Jun. 22, 2001.

(51) Int. Cl.⁷ .............................................. H01L 29/06
(52) U.S. Cl. ..................................................... 257/618
(58) Field of Search ............................. 257/618, 617, 257/347, 913; 438/407, 753

(56) References Cited

U.S. PATENT DOCUMENTS

| | | | |
|---|---|---|---|
| 5,189,500 A | 2/1993 | Kusunoki | |
| 5,194,395 A | 3/1993 | Wada | |
| 5,436,175 A | 7/1995 | Nakato et al. | |
| 5,478,408 A | 12/1995 | Mitani et al. | |
| 5,659,192 A | 8/1997 | Sarma et al. | |
| 5,919,302 A | 7/1999 | Falster et al. | |
| 5,994,761 A | 11/1999 | Falster et al. | |
| 6,180,220 B1 | 1/2001 | Falster et al. | |
| 6,190,631 B1 | 2/2001 | Falster et al. | |
| 6,191,010 B1 | 2/2001 | Falster | |
| 6,204,152 B1 | 3/2001 | Falster et al. | |
| 6,221,743 B1 | 4/2001 | Fujikawa et al. | |
| 6,236,104 B1 | 5/2001 | Falster | |
| 6,254,672 B1 | 7/2001 | Falster et al. | |
| 6,284,039 B1 | 9/2001 | Mule'Stagno et al. | |
| 6,284,384 B1 | 9/2001 | Wilson et al. | |
| 6,287,380 B1 | 9/2001 | Falster et al. | |
| 6,306,733 B1 | 10/2001 | Falster et al. | |
| 6,312,516 B2 | 11/2001 | Falster et al. | |
| 6,328,795 B2 | 12/2001 | Falster et al. | |
| 6,339,016 B1 | 1/2002 | Torack et al. | |

(Continued)

FOREIGN PATENT DOCUMENTS

| | | |
|---|---|---|
| EP | 1 087 041 A1 | 3/2001 |
| WO | WO 00/34999 A3 | 6/2000 |

OTHER PUBLICATIONS

N.W. Cheung "Plasma Immersion Ion Implantation for Semiconductor Processing" Materials Chemistry and Physics, vol. 46 (1996) pp. 132–193.

International Search Report for analogous application No. PCT/US02/199906 dated May 8, 2003.

European Search Report under Rule 112 EPC for EP 02 73 2081 dated Nov.2, 2004.

Primary Examiner—Howard Weiss
Assistant Examiner—(Vikki) Hoa B. Trinh
(74) Attorney, Agent, or Firm—Senniger Powers

(57) ABSTRACT

The present invention is directed to a process for producing a silicon on insulator (SOI) structure having intrinsic gettering, wherein a silicon substrate is subjected to an ideal precipitating wafer heat treatment which enables the substrate, during the heat treatment cycles of essentially any arbitrary electronic device manufacturing process to form an ideal, non-uniform depth distribution of oxygen precipitates, and wherein a dielectric layer is formed beneath the surface of the wafer by implanting oxygen or nitrogen ions, or molecular oxygen, beneath the surface and annealing the wafer. Additionally, the silicon wafer may initially include an epitaxial layer, or an epitaxial layer may be deposited on the substrate during the process of the present invention.

34 Claims, 12 Drawing Sheets

U.S. PATENT DOCUMENTS

| | | |
|---|---|---|
| 6,342,725 B2 | 1/2002 | Falster |
| 6,350,702 B2 * | 2/2002 | Sakaguchi et al. .......... 438/753 |
| 6,361,619 B1 | 3/2002 | Falster et al. |
| 6,368,938 B1 * | 4/2002 | Usenko ...................... 438/407 |
| 6,379,642 B1 | 4/2002 | Falster et al. |
| 6,391,662 B1 | 5/2002 | Mule'Stagno et al. |
| 6,409,826 B2 | 6/2002 | Falster et al. |
| 6,409,827 B2 | 6/2002 | Falster et al. |
| 6,416,836 B1 | 7/2002 | Falster et al. |
| 6,743,495 B2 * | 6/2004 | Vasat et al. ................ 428/64.1 |

* cited by examiner

SILICON ON INSULATOR STRUCTURE HAVING AN EPITAXIAL LAYER AND INTRINSIC GETTERING

REFERENCE TO RELATED APPLICATIONS

This application claims priority from U.S. provisional application Ser. No. 60/337,623, filed on Dec. 5, 2001 and U.S. provisional application Ser. No. 60/300,208, filed on Jun. 22, 2001.

BACKGROUND OF THE INVENTION

The present invention is directed to a process for producing a silicon on insulator (SOI) structure having intrinsic gettering. More specifically, the present invention is directed to a process for producing a SOI structure with intrinsic gettering wherein a silicon wafer or substrate is subjected to an ideal precipitating wafer heat treatment which enables the substrate, during the heat treatment cycles of essentially any arbitrary electronic device manufacturing process to form an ideal, non-uniform depth distribution of oxygen precipitates, and wherein a dielectric layer is formed beneath the surface of the substrate by implanting oxygen or nitrogen ions or molecular oxygen beneath the surface and annealing it. Additionally, the silicon substrate may initially include an epitaxial layer or an epitaxial layer may be deposited on the substrate during the process of the present invention.

A SOI structure generally comprises a handle wafer or layer, a device layer, and an insulating (i.e., dielectric) film (typically an oxide layer) between the handle layer and the device layer. Generally, the device layer is between 0.05 and 20 micrometers thick. Such a substrate may be prepared using various techniques known in the art. For example, wafer thinning techniques may be used, often referred to as back etch SOI (i.e., BESOI), wherein a silicon wafer is bound to the handle wafer and then slowly etched away until only a thin layer of silicon on the handle wafer remains. (See, e.g., U.S. Pat. No. 5,189,500, which is incorporated in its entirety herein by reference.) Alternatively, a single wafer may be used, molecular oxygen ions ($O_2^+$) or atomic oxygen ions ($O^+$) being implanted below the surface of the wafer to form an oxide layer. This process is generally referred to as SIMOX (i.e., separation by implantation of oxygen; see, e.g., U.S. Pat. No. 5,436,175 and *Plasma Immersion Ion Implantation For Semiconductor Processing*, Materials Chemistry and Physics 46 (1996) 132–139, both of which are incorporated herein by reference in their entireties). Such a process is considered advantageous because it acts to reduce the number of silicon wafers which are consumed, as compared to the more conventional wafer thinning processes, in the preparation of a SOI structure.

SOI structures may be prepared from silicon wafers sliced from single crystal silicon ingots grown in accordance with the Czochralski method. In recent years, it has been recognized that a number of defects in single crystal silicon form during the growth process as the crystal cools after solidification. Such defects arise, in part, due to the presence of an excess (i.e., a concentration above the solubility limit) of intrinsic point defects, which are known as vacancies and self-interstitials. Silicon crystals grown from a melt typically contain an excess of one or the other type of intrinsic point defect, either crystal lattice vacancies or silicon self-interstitials. It has been suggested that the type and initial concentration of these point defects in the silicon are determined at the time of solidification and, if these concentrations reach a level of critical supersaturation in the system and the mobility of the point defects is sufficiently high, a reaction, or an agglomeration event, will likely occur. Agglomerated intrinsic point defects in silicon can severely impact the yield potential of the material in the production of complex and highly integrated circuits, such as those utilizing SOI structures.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Also present in regions of excess vacancies are defects which act as the nuclei for ring oxidation induced stacking faults (OISF). It is speculated that this particular defect is a high temperature nucleated oxygen agglomerate catalyzed by the presence of excess vacancies.

In addition to the above-mentioned vacancy-type defects, it is also believed that agglomerated vacancy defects, or voids, may be the cause of "HF defects" (i.e., metal precipitation defects). HF defects are, like these other vacancy-type defects, considered to be a critical problem with current SOI technology.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

Agglomerated intrinsic point defects can create performance problems for SOI substrates if silicon wafers containing such defects are utilized as the source of the device layer. Performance problems may also result from metallic contaminants present in the handle wafer or layer of the SOI structure. This is because, during the heat treatments employed by the SOI process, metallic contaminants present in the handle wafer or layer as a result of, for example, cleaning and handling of the SOI structure, may migrate through the silicon matrix until the oxide layer, present between the handle wafer and the device layer, is reached. Although generally speaking these impurities may not pass through the oxide layer and into the device layer, the oxide layer is a preferential site for the precipitation of these impurities. This precipitation acts to disrupt the oxide layer and interfere with the performance of the SOI device made from the SOI structure.

Accordingly, a need continues to exist for a SOI structure which contains a device layer which is substantially free of agglomerated intrinsic point defects. Additionally, a need continues to exist for a SOI structure which contains a handle wafer or layer capable of inhibiting the precipitation of metallic impurities at or near the oxide layer/silicon interface.

SUMMARY OF THE INVENTION

Among the features of the present invention, therefore, is the provision of a silicon on insulator structure having a device layer comprising an epitaxial layer and a handle wafer or layer having improved gettering capabilities; the provision of such a structure wherein the handle wafer or layer is capable, during the heat treatment cycles of essentially any arbitrary electronic device manufacturing process, of forming an ideal, non-uniform depth distribution of oxygen precipitates; and, the provision of such a structure which is less susceptible to the formation of metal precipitate defects during device fabrication.

Further among the features of the present invention is the provision of a process for producing a silicon on insulator structure, the process comprising subjecting a silicon wafer or substrate to an ideal precipitating heat treatment and implanting an oxide layer beneath the surface thereof; the provision of such a process further comprising depositing an epitaxial layer on the surface of the substrate; and, the provision of such a process wherein, as part of said ideal precipitating heat treatment, the substrate is further subjected to an oxygen precipitation and stabilization heat treatment to cause the formation of intrinsic gettering sites capable of surviving the oxygen implantation and/or epitaxial deposition process steps.

Briefly, therefore, the present invention is directed to a silicon on insulator structure which comprises (i) a supporting handle wafer or layer which, upon being subjected to an oxygen precipitation heat treatment (e.g., a treatment consisting essentially of annealing the wafers at 800° C. for four hours and then at 1000° C. for sixteen hours), forms a non-uniform depth distribution of oxygen precipitates, (ii) a single crystal silicon device layer comprising an epitaxial layer, and (iii) a dielectric layer between the supporting layer and the device layer.

The present invention is further directed to a silicon on insulator structure which comprises (i) a supporting handle wafer or layer which comprises a non-uniform distribution of stabilized oxygen precipitates, (ii) a single crystal silicon device layer comprising an epitaxial layer, and (iii) a dielectric layer between the supporting layer and the device layer.

The present invention is further directed to a silicon on insulator structure which comprises (i) a supporting handle wafer or layer comprising a distribution of secondary defects (e.g., prismatic dislocation loops or tangles or stacking faults) which act as intrinsic gettering sites, (ii) a single crystal silicon device layer comprising an epitaxial layer, and (iii) a dielectric layer between the supporting layer and the device layer.

The present invention is further directed to a process for producing a silicon on insulator structure, the process comprising the steps of: subjecting a single crystal silicon substrate having two major, generally parallel surfaces, one of which is the front surface and the other of which is the back surface, a central plane between the front and back surfaces, a circumferential edge joining the front and back surfaces, a surface layer which comprises a first region of the silicon substrate between the front surface and a distance, $D_1$, as measured from the front surface and toward the central plane, and a bulk layer which comprises a second region of the silicon wafer between the central plane and the first region, to an ideal precipitating heat treatment to cause the formation of a non-uniform depth distribution of crystal lattice vacancies in the wafer, with the concentration of vacancies in the bulk layer being greater than the concentration of vacancies in the surface layer; depositing an epitaxial layer on the front surface of the substrate; and, implanting oxygen beneath the front surface of the substrate to form an oxide layer beneath this surface.

The present invention is further directed to a process for producing a silicon on insulator structure, the process comprising the steps of: subjecting a single crystal silicon substrate having two major, generally parallel surfaces, one of which is the front surface and the other of which is the back surface, a central plane between the front and back surfaces, a circumferential edge joining the front and back surfaces, a surface layer which comprises a first region of the silicon substrate between the front surface and a distance, $D_1$, as measured from the front surface and toward the central plane, and a bulk layer which comprises a second region of the silicon wafer between the central plane and the first region, to an ideal precipitating heat treatment to cause the formation of a non-uniform depth distribution of crystal lattice vacancies in the substrate, with the concentration of vacancies in the bulk layer being greater than the concentration of vacancies in the surface layer; subjecting the silicon substrate to an oxygen precipitation heat treatment to cause the nucleation and growth of oxygen precipitates in the bulk layer to a size sufficient to stabilize the oxygen precipitates, such that they are incapable of being dissolved at temperatures not in excess of 1150° C.; depositing an epitaxial layer on the front surface of the substrate; and, implanting oxygen beneath the front surface of the substrate to form an oxide layer beneath the surface.

The present invention is further directed to a process for producing a silicon on insulator structure, the process comprising the steps of: subjecting a single crystal silicon substrate having two major, generally parallel surfaces, one of which is the front surface and the other of which is the back surface, a central plane between the front and back surfaces, a circumferential edge joining the front and back surfaces, a surface layer which comprises a first region between the front surface and a distance, $D_1$, as measured from the front surface and toward the central plane, and a bulk layer which comprises a second region between the central plane and the first region, to an ideal precipitating heat treatment to cause the formation of a non-uniform depth distribution of crystal lattice vacancies in the substrate, with the concentration of vacancies in the bulk layer being greater than the concentration of vacancies in the surface layer; subjecting the silicon substrate to an oxygen precipitation heat treatment to cause the nucleation and growth of oxygen precipitates in the bulk layer to a size sufficient to stabilize the oxygen precipitates, such that they are incapable of being dissolved during a subsequent oxygen implantation process; depositing an epitaxial layer on the front surface of the substrate; and, implanting oxygen beneath the front surface of the substrate to form an oxide layer beneath the surface.

The present invention is further directed to a process for producing a silicon on insulator structure, the process comprising the steps of: subjecting a single crystal silicon substrate having two major, generally parallel surfaces, one of which is the front surface and the other of which is the back surface, a central plane between the front and back surfaces, a circumferential edge joining the front and back surfaces, a surface layer which comprises a first region of the silicon substrate between the front surface and a distance, $D_1$, as measured from the front surface and toward the central plane, and a bulk layer which comprises a second region of the silicon substrate between the central plane and the first region, to an ideal precipitating heat treatment to cause the formation of a non-uniform distribution of crystal lattice vacancies in the substrate, with the concentration of vacancies in the bulk layer being greater than the concentration of vacancies in the surface layer; subjecting the silicon substrate to a heat treatment to cause the formation of secondary defects (e.g., prismatic dislocation loops or tangles or stacking faults) and/or oxygen precipitates capable of surviving subsequent epitaxial deposition and/or oxygen implantation processes; depositing an epitaxial layer on the front surface of the substrate; and, implanting oxygen beneath the front surface of the substrate to form an oxide layer beneath the surface.

The present invention is further directed to a process for producing a silicon on insulator structure, the process comprising the steps of: subjecting a single crystal silicon substrate having two major, generally parallel surfaces, one of which is the front surface and the other of which is the back surface, a central plane between the front and back surfaces, a circumferential edge joining the front and back surfaces, a surface layer which comprises a first region of the silicon substrate between the front surface and a distance, $D_1$, as measured from the front surface and toward the central plane, and a bulk layer which comprises a second region of the silicon substrate between the central plane and the first region, to an ideal precipitating heat treatment to cause the formation of a non-uniform distribution of crystal lattice vacancies in the substrate, with the concentration of vacancies in the bulk layer being greater than the concentration of vacancies in the surface layer; depositing an epitaxial layer on the front surface of the substrate; implanting oxygen beneath the front surface of the substrate to form an oxide layer beneath the surface of the substrate; and, subjecting the oxygen implanted substrate to a thermal anneal to redistribute the implanted oxygen as it chemically bonds with the silicon to form a silicon dioxide ($SiO_2$) layer therein.

The present invention is further directed to a process for producing a silicon on oxide structure comprising a substrate having two major, generally parallel surfaces, one of which is the front surface and the other of which is the back surface, a central plane between the front and back surfaces, a surface layer which comprises a first region of the substrate between the front surface and a distance, $D_1$, as measured from the front surface and toward the central plane, and a bulk layer which comprises a second region of the substrate between the central plane and the first region, a circumferential edge joining the front and back surfaces, a central axis, and a radius extending from the central axis to the circumferential edge. The process comprises implanting oxygen into the silicon substrate to cause the formation of a dielectric layer which is generally parallel to the front surface and which is located in a region between the front surface and the central plane; subjecting the silicon substrate to an ideal precipitating heat treatment to cause the formation of a non-uniform depth distribution of crystal lattice vacancies with the concentration of vacancies in the bulk layer being greater than the concentration of vacancies in the surface layer; and, subjecting the ideal precipitating silicon substrate to an oxygen precipitation and stabilization heat-treatment to cause the formation and stabilization of oxygen precipitates in the bulk layer and a precipitate-free zone in the surface layer.

Other objects and features of this invention will be in part apparent and in part pointed out hereinafter.

DETAILED DESCRIPTION OF THE PREFERRED EMBODIMENTS

In accordance with the present invention, a process has been discovered for preparing a silicon on insulator (SOI) structure having a sufficient density of oxygen precipitates and/or secondary defects for intrinsic gettering (IG) purposes. According to one embodiment of the process of the present invention, oxygen is implanted beneath the surface of a single crystal silicon substrate wafer and then it is subjected to an ideal precipitating wafer heat treatment process, as further described herein. In one embodiment, an epitaxial layer is deposited on the surface of the substrate, either before or after oxygen implantation and/or the ideal precipitating wafer treatment.

The ideal precipitating wafer heat treatment process creates a "template" in the silicon substrate wafer which determines or "prints" the manner in which oxygen will precipitate therein. As part of the ideal precipitating wafer heat treatment process, the substrate may additionally be subjected to a thermal anneal to precipitate oxygen and stabilize the oxygen precipitates so that they survive the oxygen implantation process and/or epitaxial deposition process (depending upon the particular order of process steps employed). Alternatively, the oxygen precipitates may be grown to a size sufficient to cause the formation of secondary defects, such as prismatic dislocation loops or tangles or stacking faults. In this manner, the secondary defects may also be formed according to the vacancy template for intrinsic gettering purposes, thus producing SOI substrate having sufficient intrinsic gettering capabilities even if the oxygen precipitates formed therein are later dissolved.

The starting material for the present invention is a single crystal silicon wafer which has been sliced from a single crystal silicon ingot, in one embodiment being grown in accordance with conventional Czochralski techniques. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, N.Y., 1982. Preferably, however, the starting wafer contains a region which is substantially free of agglomerated intrinsic point defects, the wafer being obtained from a single crystal silicon ingot grown in accordance with the methods described in, for example, U.S. Pat. Nos. 6,254,672 and 5,919,302 (both of which are incorporated herein by reference in their entireties).

Figure 1:
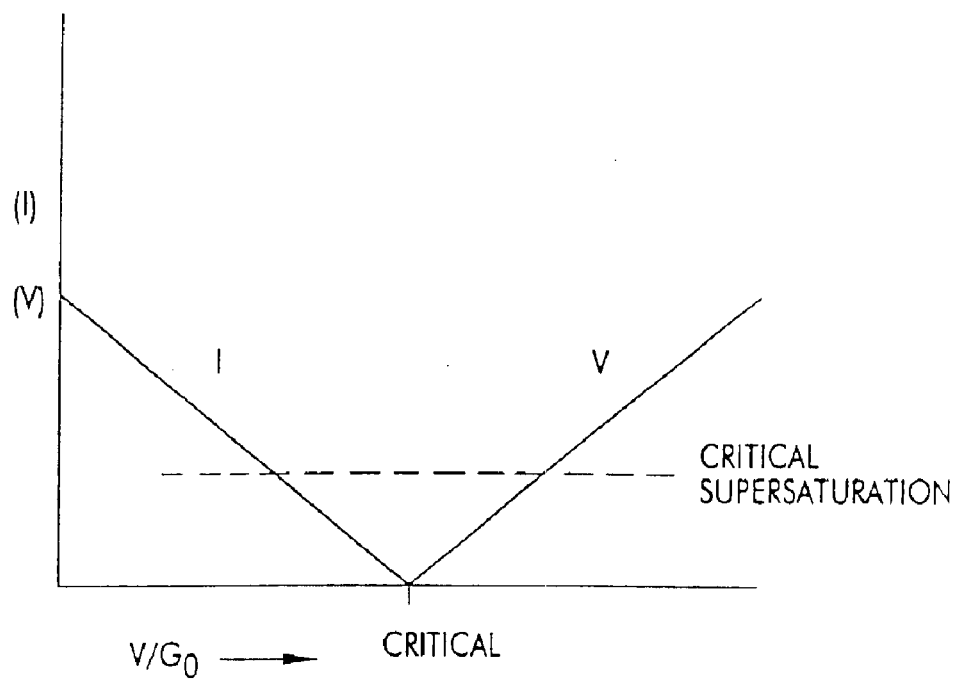
FIG. 1 is a graph which shows an example of how the initial concentration of self-interstitials, [I], and vacancies, [V], changes with an increase in the value of the ratio $v/G_0$, where v is the growth rate and $G_0$ is the average axial temperature gradient.
Figure 2:
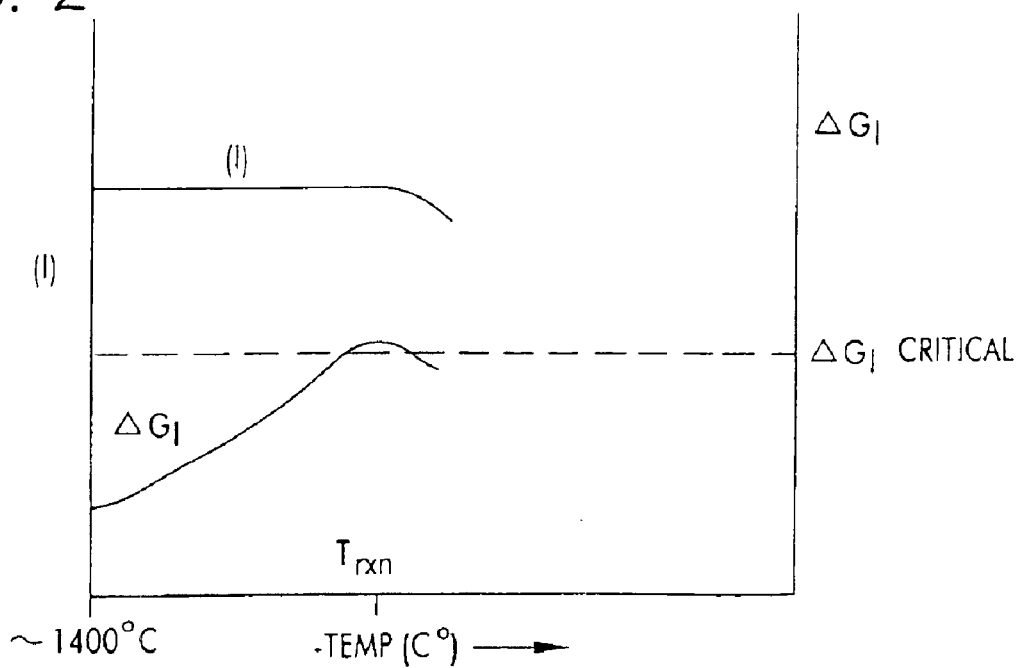
FIG. 2 is a graph which shows an example of how $\Delta G_I$, the change in free energy required for the formation of agglomerated interstitial defects, increases as the temperature, T, decreases, for a given initial concentration of self-interstitials, [I].

With regard to the formation of a single crystal silicon wafer which is substantially free of such defects, it is to be noted that the type and initial concentration of intrinsic point defects appear to be initially determined as the ingot cools from the temperature of solidification (i.e., about 1410° C.) to a temperature greater than 1300° C. (i.e., at least about 1325° C., at least about 1350° C. or even at least about 1375° C.); that is, the type and initial concentration of these defects are controlled by the ratio $v/G_0$, where v is the growth velocity and $G_0$ is the average axial temperature gradient over this temperature range. Referring now to FIG. 1, for increasing values of $v/G_0$, a transition from decreasingly self-interstitial dominated growth to increasingly vacancy dominated growth occurs near a critical value of $v/G_0$ which, based upon currently available information, appears to be about $2.1 \times 10^{-5}$ cm$^2$/sK, where $G_0$ is determined under conditions in which the axial temperature gradient is constant within the temperature range defined above. At this critical value, the concentrations of these intrinsic point defects are at equilibrium. However, as the value of $v/G_0$ exceeds the critical value, the concentration of vacancies increases. Likewise, as the value of $v/G_0$ falls below the critical value, the concentration of self-interstitials increases. If these concentrations reach a level of critical supersaturation in the system, and if the mobility of the point defects is sufficiently high, a reaction, or an agglomeration event, will likely occur.

I. Crystal Growth

As reported elsewhere (see, e.g., U.S. Pat. Nos. 6,254,672 and 5,919,302), it has been discovered that the reactions in which vacancies or self-interstitials agglomerate to produce defects can be suppressed. Without being bound to a particular theory, it is generally believed that these reactions can be suppressed if the concentration of vacancies or self-interstitials is controlled during the growth and cooling of the crystal ingot, such that the change in free energy ($\Delta G$) of the system never exceeds a critical value at which these agglomeration reactions spontaneously occur. In other words, it is believed that the agglomeration of vacancies and interstitials can be avoided as the ingot cools from the temperature of solidification by preventing the system from becoming critically supersaturated in vacancies or interstitials.

Preventing the formation of such defects can be achieved by establishing an initial concentration of vacancies or interstitials (controlled by $v/G_0$ (r), where $v/G_0$ (r) represent $v/G_0$ as a function of radial position, as further discussed below) which is sufficiently low, such that critical supersaturation is never achieved. In practice, however, such concentrations are difficult to achieve across an entire crystal radius and, in general, therefore, critical supersaturation may be avoided by suppressing the initial vacancy concentration or the initial interstitial concentration subsequent to crystal solidification (i.e., subsequent to establishing the initial concentration as determined by $v/G_0$ (r)).

Due to the relatively large mobility of self-interstitials (which is generally about $10^{-4}$ cm$^2$/second), and to a lesser extent the mobility of vacancies, it is possible to affect the suppression of interstitials and vacancies over relatively large distances (i.e., distances of about 5 cm to about 10 cm or more) by the radial diffusion of self-interstitials to sinks located at the crystal surface or to vacancy dominated regions located within the crystal. Radial diffusion can be effectively used to suppress the concentration of self-interstitials and vacancies, provided sufficient time is allowed for the radial diffusion of the initial concentration of intrinsic point defects. In general, the diffusion time will depend upon the radial variation in the initial concentration of self-interstitials and vacancies, with lesser radial variations requiring shorter diffusion times.

Figure 3:
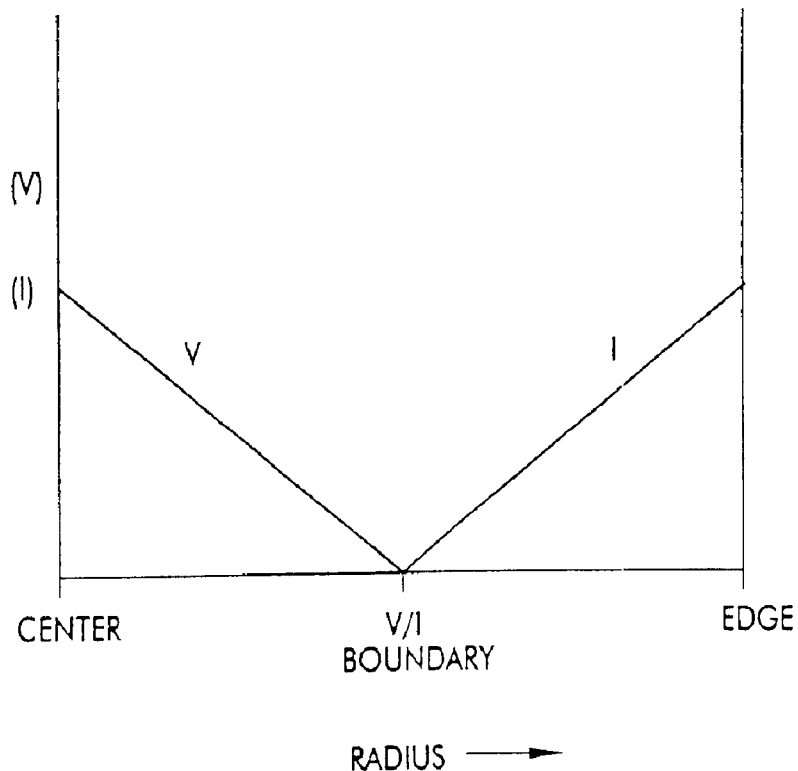
FIG. 3 is a graph which shows an example of how the initial concentration of self-interstitials, [I], and vacancies, [V], can change along the radius of an ingot or wafer, as the value of the ratio $v/G_0$ decreases, due to an increase in the value of $G_0$. Note that at the V/I boundary a transition occurs from vacancy dominated material to self-interstitial dominated material.
Figure 4:
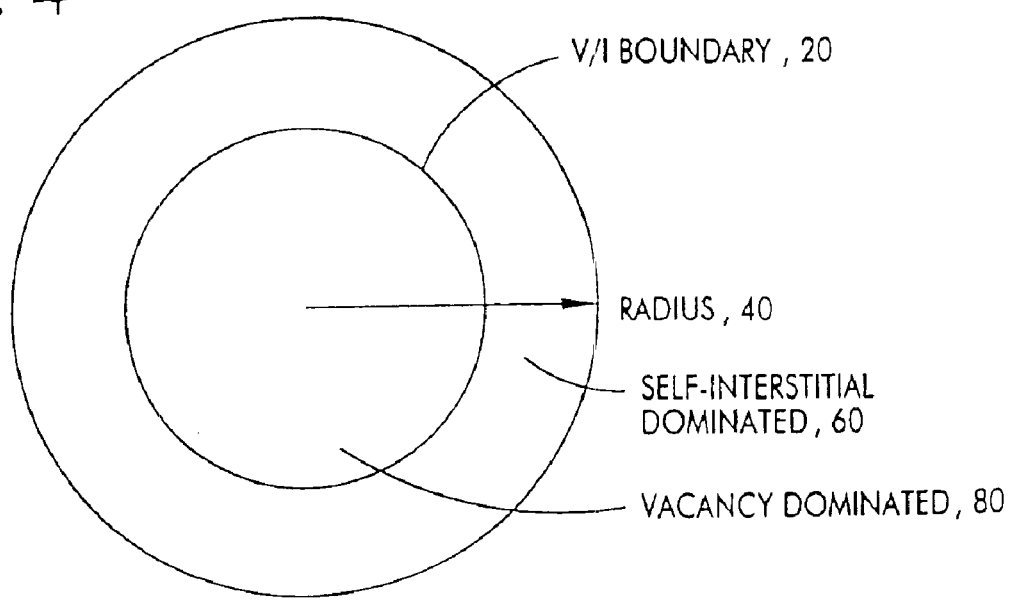
FIG. 4 is a top plan view of a single crystal silicon ingot or wafer showing regions of vacancy, V, and self-interstitial, I, dominated materials respectively, as well as the V/I boundary that exists between them.

Typically, the average axial temperature gradient, $G_0$, increases as a function of increasing radius for single crystal silicon, which is grown according to the Czochralski method. This means that the value of $v/G_0$ is typically not singular across the radius of an ingot. As a result of this variation, the type and initial concentration of intrinsic point defects is not constant. If the critical value of $v/G_0$, denoted in FIGS. 3 and 4 as the V/I boundary 20, is reached at some point along the radius 40 of the ingot, the material will switch from being vacancy dominated to self-interstitial dominated. In addition, the ingot will contain an axially symmetric region of self-interstitial dominated material 60 (in which the initial concentration of silicon self-interstitial atoms increases as a function of increasing radius), surrounding a generally cylindrical region of vacancy dominated material 80 (in which the initial concentration of vacancies decreases as a function of increasing radius).

As an ingot containing a V/I boundary is cooled from the temperature of solidification, radial diffusion of interstitial atoms and vacancies causes a radially inward shift in the V/I boundary due to a recombination of self-interstitials with vacancies. In addition, radial diffusion of self-interstitials to the surface of the crystal will occur as the crystal cools. The surface of the crystal is capable of maintaining near equilibrium point defect concentrations as the crystal cools. Radial diffusion of point defects will tend to reduce the self-interstitial concentration outside the V/I boundary and the vacancy concentration inside the V/I boundary. If enough time is allowed for diffusion, therefore, the concentration of vacancy and interstitials everywhere may be such that the free energy of these respective systems will be less than the critical values at which agglomeration reactions occur.

Figure 5:
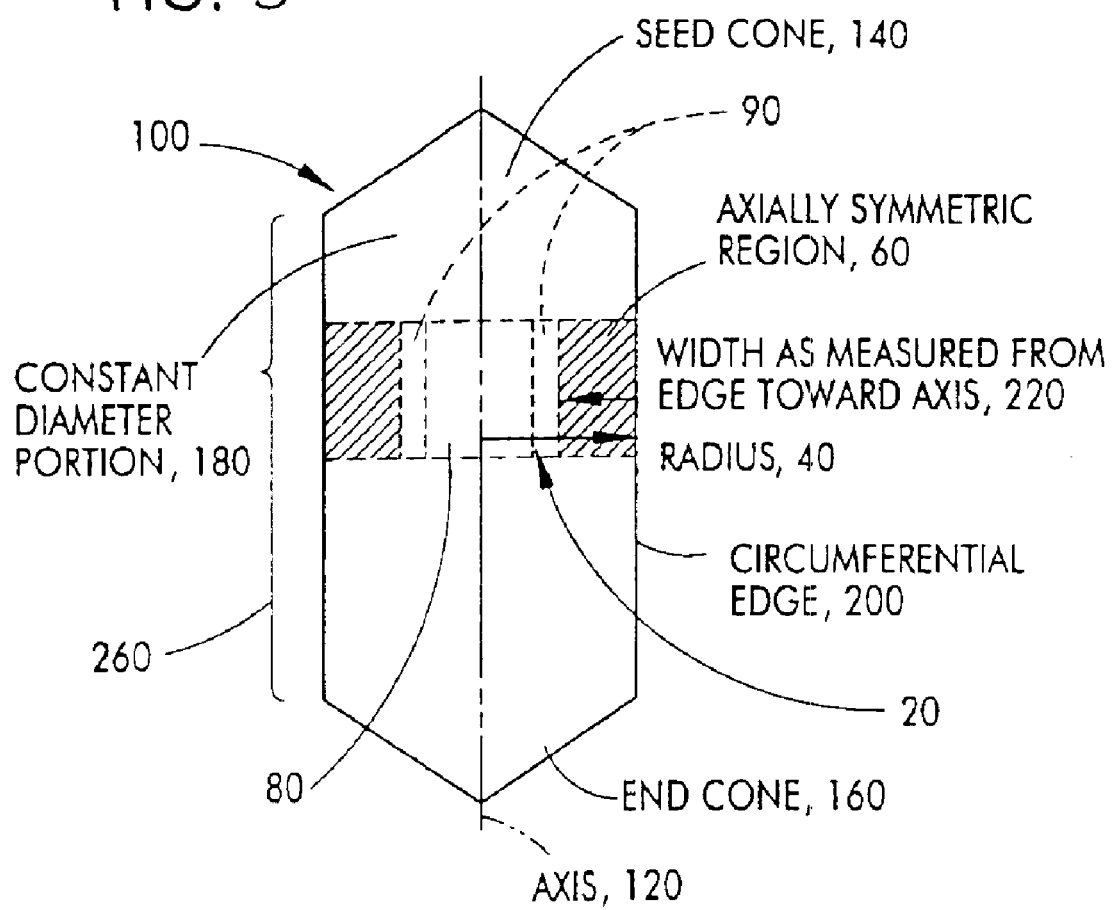
FIG. 5 is a longitudinal, cross-sectional view of a single crystal silicon ingot showing, in detail, an axially symmetric region of a constant diameter portion of the ingot.

Referring to FIG. 5, the crystal growth conditions, including growth velocity, v, the average axial temperature gradient, $G_0$, and the cooling rate are preferably controlled to cause the formation of a single crystal silicon ingot 100, grown in accordance with the Czochralski method, comprising a central axis 120, a seed-cone 140, an end-cone 160 and a constant diameter portion 180 between the seed-cone and the end-cone. The constant diameter portion of the ingot, from which the wafer of the present invention can be obtained, has a circumferential edge 200 and a radius 40 extending from the central axis 120 to the circumferential edge 200. The growth conditions may be controlled to cause the formation of (i) a substantially defect-free axially symmetric region of interstitial dominated material 60, and/or (ii) an axially symmetric region of vacancy dominated material 80, at least a portion 90 of which is substantially defect-free. When present, the axially symmetric regions 60 and 90 may have varying widths, as further discussed in detail below.

The growth velocity, v, and the average axial temperature gradient, $G_0$, (as previously defined) are typically controlled such that the ratio $v/G_0$ ranges in value from about 0.5 to about 2.5 times the critical value of $v/G_0$ (i.e., about $1 \times 10^{-5}$ cm$^2$/sK to about $5 \times 10^{-5}$ cm$^2$/sK based upon currently available information for the critical value of $v/G_0$). Preferably, the ratio $v/G_0$ will range in value from about 0.6 to about 1.5 times the critical value of $v/G_0$ (i.e., about $1.3 \times 10^{-5}$ cm$^2$/sK to about $3 \times 10^{-5}$ cm$^2$/sK based upon currently available information for the critical value of $v/G_0$). Most preferably, the ratio $v/G_0$ will range in value from about 0.75 to about 1.25 times the critical value of $v/G_0$ (i.e., about $1.6 \times 10^{-5}$ cm$^2$/sK to about $2.1 \times 10^{-5}$ cm$^2$/sK based upon currently available information for the critical value of $v/G_0$). In one particularly preferred embodiment, $v/G_0$ within the axially symmetric region 90 has a value falling between the critical value of $v/G_0$ and 1.1 times the critical value of $v/G_0$. In another particularly preferred embodiment, $v/G_0$ within the axially symmetric region 60 has a value falling between about 0.75 times the critical value of $v/G_0$ and the critical value of $v/G_0$.

To maximize the width of the axially symmetric region 60 or 90, it is preferred that the ingot be cooled from the solidification temperature to a temperature in excess of about 1050° C. over a period of (i) at least about 5 hours, preferably at least about 10 hours, and more preferably at least about 15 hours for 150 mm nominal diameter silicon crystals, (ii) at least about 5 hours, preferably at least about 10 hours, more preferably at least about 20 hours, still more preferably at least about 25 hours, and most preferably at least about 30 hours for 200 mm nominal diameter silicon crystals, and (iii) at least about 20 hours, preferably at least about 40 hours, more preferably at least about 60 hours, and most preferably at least about 75 hours for silicon crystals having a nominal diameter greater than 200 mm. Control of the cooling rate can be achieved by using any means currently known in the art for minimizing heat transfer, including the use of insulators, heaters, radiation shields, and magnetic fields.

Control of the average axial temperature gradient, $G_0$, may be achieved through the design of the "hot zone" of the crystal puller, i.e., the graphite (or other materials) that makes up the heater, insulation, heat and radiation shields, among other things. Although the design particulars may vary depending upon the make and model of the crystal puller, in general, $G_0$ may be controlled using any of the means currently known in the art for controlling heat transfer at the melt/solid interface, including reflectors, radiation shields, purge tubes, light pipes, and heaters. In general, radial variations in $G_0$ are minimized by positioning such an apparatus within about one crystal diameter above the melt/solid interface. $G_0$ can be controlled further by adjusting the position of the apparatus relative to the melt and crystal. This is accomplished either by adjusting the position of the apparatus in the hot zone, or by adjusting the position of the melt surface in the hot zone. In addition, when a heater is employed (e.g., a bottom heater, or a heater positioned within the growth chamber of the crystal puller below the crucible), $G_0$ may be further controlled by adjusting the power supplied to the heater. Any, or all, of these methods can be used during a batch Czochralski process in which melt volume is depleted during the process.

It is generally preferred for some embodiments of the process for preparing a substantially defect-free wafer that the average axial temperature gradient, $G_0$, be relatively constant as a function of the diameter of the ingot. However, it should be noted that as improvements in hot zone design allow for variations in $G_0$ to be minimized, mechanical issues associated with maintaining a constant growth rate become an increasingly important factor. This is because the growth process becomes much more sensitive to any variation in the pull rate, which in turn directly affects the growth rate, v. In terms of process control, this means that it is favorable to have values for $G_0$ which differ over the radius of the ingot. Significant differences in the value of $G_0$, however, can result in a large concentration of self-interstitials generally increasing toward the wafer edge and, thereby, increase the difficultly in avoiding the formation of agglomerated intrinsic point defects.

In view of the foregoing, the control of $G_0$ involves a balance between minimizing radial variations in $G_0$ and maintaining favorable process control conditions. Typically, therefore, the pull rate after about one diameter of the crystal length will range from about 0.2 mm/minute to about 0.8 mm/minute. Preferably, the pull rate will range from about 0.25 mm/minute to about 0.6 mm/minute and, more preferably, from about 0.3 mm/minute to about 0.5 mm/minute. It is to be noted that the pull rate is dependent upon both the crystal diameter and crystal puller design. The stated ranges are typical for 200 mm diameter crystals. In general, the pull rate will decrease as the crystal diameter increases. However, the crystal puller may be designed to allow pull rates in excess of those stated here. As a result, most preferably the crystal puller will be designed to enable the pull rate to be as fast as possible while still allowing for the formation of an axially symmetric region or regions in accordance with the present invention.

The amount of self-interstitial diffusion is controlled by controlling the cooling rate as the ingot is cooled from the solidification temperature (about 1410° C.) to the temperature at which silicon self-interstitials become immobile for commercially practical purposes. Silicon self-interstitials appear to be extremely mobile at temperatures near the solidification temperature of silicon, i.e., about 1410° C. This mobility, however, decreases as the temperature of the single crystal silicon ingot decreases. Generally, the diffusion rate of self-interstitials slows such a considerable degree that they are essentially immobile for commercially practical time periods at temperatures less than about 700° C., and perhaps at temperatures as great as 800° C., 900° C., 1000° C., or even 1050° C.

It is to be noted in this regard that, although the temperature at which a self-interstitial agglomeration reaction occurs may in theory vary over a wide range of temperatures, as a practical matter this range appears to be relatively narrow for conventional, Czochralski-grown silicon. This is a consequence of the relatively narrow range of initial self-interstitial concentrations which are typically obtained in silicon grown according to the Czochralski method. In general, therefore, a self-interstitial agglomeration reaction may occur, if at all, at temperatures within the range of about 1100° C. to about 800° C., and typically at a temperature of about 1050° C.

Accordingly, within the range of temperatures at which self-interstitials appear to be mobile, and depending upon the temperature in the hot zone, the cooling rate will typically range from about 0.1° C./minute to about 3° C./minute. Preferably, the cooling rate will range from about 0.1° C./minute to about 1.5° C./minute, more preferably from about 0.1° C./minute to about 1° C./minute, and still more preferably from about 0.1° C./minute to about 0.5° C./minute.

By controlling the cooling rate of the ingot within a range of temperatures in which self-interstitials appear to be mobile, the self-interstitials may be given more time to diffuse to sinks located at the crystal surface, or to vacancy dominated regions, where they may be annihilated. The concentration of such interstitials may, therefore, be suppressed, which act to prevent an agglomeration event from occurring. Utilizing the diffusivity of interstitials by controlling the cooling rate acts to relax the otherwise stringent $v/G_0$ requirements that may be needed in order to obtain an axially symmetric region free of agglomerated defects. Stated another way, as a result of the fact that the cooling rate may be controlled in order to allow interstitials more time to diffuse, a larger range of $v/G_0$ values, relative to the critical value, are acceptable for purposes of obtaining an axially symmetric region free of agglomerated defects.

To achieve such cooling rates over appreciable lengths of the constant diameter portion of the crystal, consideration must also be given to the growth process of the end-cone of the ingot, as well as the treatment of the ingot once end-cone growth is complete. Typically, upon completion of the growth of the constant diameter portion of the ingot, the pull rate will be increased in order to begin the tapering necessary to form the end-cone. However, such an increase in pull rate may result in the lower segment of the constant diameter portion cooling more quickly within the temperature range in which interstitials are sufficiently mobile, as discussed above. As a result, these interstitials may not have sufficient time to diffuse to sinks to be annihilated; that is, the concentration in this lower segment may not be suppressed to a sufficient degree and agglomeration of interstitial defects may result.

In order to prevent the formation of such defects from occurring in this lower segment of the ingot, it is preferred that the constant diameter portion of the ingot have a uniform thermal history in accordance with the Czochralski method. A uniform thermal history may be achieved by pulling the ingot from the silicon melt at a relatively constant rate during the growth of not only the constant diameter portion, but also during the growth of the end-cone of the crystal and possibly subsequent to the growth of the end-cone. More specifically, it is preferred that when the growth of the end-cone is initiated a pull rate for the end-cone is established which ensures any segment of the constant diameter portion of the ingot remaining at a temperature in excess of about 1050° C. will experience the same thermal history as other segment(s) of the constant diameter portion of the ingot which contain an axially symmetric region free of agglomerated intrinsic point defects which have already cooled to a temperature of less than about 1050° C. A relatively constant pull rate may be achieved, for example, by (i) reducing the rates of rotation of the crucible and crystal during the growth of the end-cone relative to the crucible and crystal rotation rates during the growth of the constant diameter portion of the crystal, and/or (ii) increasing the power supplied to the heater used to heat the silicon melt during the growth of the end-cone relative to the power conventionally supplied during end-cone growth. These additional adjustments of the process variables may occur either individually or in combination.

As previously noted, a minimum radius of the vacancy dominated region exists for which the suppression of agglomerated interstitial defects may be achieved. The value of the minimum radius depends on $v/G_0$ (r) and the cooling rate. As crystal puller and hot zone designs will vary, the ranges presented above for $v/G_0$ (r), pull rate, and cooling rate will also vary. Likewise these conditions may vary along the length of a growing crystal. Also as noted above, the width of the interstitial dominated region free of agglomerated interstitial defects is preferably maximized, in some embodiments. Thus, it is desirable to maintain the width of this region to a value which is as close as possible to, without exceeding, the difference between the crystal radius and the minimum radius of the vacancy dominated region along the length of the growing crystal in a given crystal puller.

The crystal pull rate profile needed in order to maximize the width of axially symmetric regions 60 and 90 for a given crystal puller hot zone design may be determined empirically. Generally speaking, this empirical approach involves first obtaining readily available data on the axial temperature profile for an ingot grown in a particular crystal puller, as well as the radial variations in the average axial temperature gradient for an ingot grown in the same puller. Collectively, this data is used to pull one or more single crystal silicon ingots, which are then analyzed for the presence of agglomerated interstitial defects. In this way, an optimum pull rate profile can be determined.

In addition to the radial variations in $v/G_0$ resulting from an increase in $G_0$ over the radius of the ingot, $v/G_0$ may also vary axially as a result of a change in v, or as a result of natural variations in $G_0$ due to the Czochralski process. For a standard Czochralski process, v is altered as the pull rate is adjusted throughout the growth cycle, in order to maintain the ingot at a constant diameter. These adjustments or changes in the pull rate, in turn, cause $v/G_0$ to vary over the length of the constant diameter portion of the ingot. Accordingly, it is therefore desirable in the present process to control the pull rate in order to maximize the width of the axially symmetric region of the ingot. As a result, however, variations in the radius of the ingot may occur. In order to ensure that the resulting ingot has a constant diameter, the ingot is therefore preferably grown to a diameter larger than that which is desired. The ingot is then subjected to processes standard in the art to remove excess material from the surface, thus ensuring that an ingot having a constant diameter portion is obtained.

Referring again to FIG. 5, wafers from which the device layer of the present invention may be obtained are sliced from a single crystal silicon ingot 100. This ingot may contain an axially symmetric region of self-interstitial dominated material 60, which may additionally surround a generally cylindrical region of vacancy dominated material 80, a portion or all of which may also contain region 90 which is substantially free of agglomerated intrinsic point defects; alternatively, the self-interstitial dominated region 60 may extend from center to edge, or the vacancy dominated region 90 may extend from center to edge.

In another embodiment, an axially symmetric region 90 has a width, as measured along the radius 40 extending from V/I boundary 20 to axis 120, which is at least about 15 mm in width, and preferably has a width which is at least about 7.5%, more preferably at least about 15%, still more preferably at least about 25%, and most preferably at least about 50% of the radius of the constant diameter portion of the ingot. In a particularly preferred embodiment, axially symmetric region 90 includes axis 120 of the ingot, i.e., the axially symmetric region 90 and the generally cylindrical region 80 coincide. Stated another way, ingot 100 includes a generally cylindrical region of vacancy dominated material 80, at least a portion of which is free of agglomerated defects. In addition, axially symmetric region 90 extends over a length of at least about 20%, preferably at least about 40%, more preferably at least about 60%, and still more preferably at least about 80% of the length of the constant diameter portion of the ingot.

In yet another embodiment, such wafers may be obtained from a single crystal silicon ingot 100 comprising an axially symmetric region 60 which generally has a width 220, as measured from circumferential edge 200 radially inward toward central axis 120, of at least about 30%, and in some embodiments at least about 40%, at least about 60%, or even at least about 80% of the radius of the constant diameter portion of the ingot. In addition, the axially symmetric region generally extends over a length 260 of at least about 20%, preferably at least about 40%, more preferably at least about 60%, and still more preferably at least about 80% of the length of the constant diameter portion of the ingot.

It is to be noted that the width of axially symmetric regions 60 and 90 may have some variation along the length of the central axis 120. For an axially symmetric region of a given length, therefore, the width 220 of axially symmetric region 60 is determined by measuring the distance from the circumferential edge 200 of the ingot 100 radially toward a point which is farthest from the central axis. In other words, the width is measured such that the minimum distance within the given length of the axially symmetric region 60 is determined. Similarly, the width of axially symmetric region 90 is determined by measuring the distance from the V/I boundary 20 radially toward a point which is farthest from the central axis 120. In other words, the width is measured such that the minimum distance within the given length of the axially symmetric region 90 is determined.

By controlling the growth conditions, a single crystal silicon wafer may be obtained which is substantially free of either agglomerated vacancy type defects, agglomerated interstitial type defects or both types of agglomerated intrinsic point defects. In general, the agglomerated vacancy type defects are considered to be more problematic that the agglomerated interstitial defects. Thus, while the wafer may comprise an axially symmetric region having agglomerated interstitial type defects with the width of the region being less than or equal to the radius of the wafer, it is preferred that the wafer have an axially symmetric region of substantial radial width which is substantially free of at least the agglomerated vacancy type defects. Even more preferably, the wafer will have and axially symmetric region of substantial radial width which is substantially free of both types of agglomerated intrinsic point defects. Using such a wafer as the source for a SOI structure yields a structure having a device layer which contains an axially symmetric region of substantial radial width which is substantially free of agglomerated intrinsic point defects. Such a device layer is advantageous because it eliminates many of the performance problems associated with the present of such defects in the device layer.

II. Ideal Precipitating Heat Treatment

The ideal precipitating wafer heat treatment process may be applied to a single crystal silicon wafer, a single crystal silicon wafer having an epitaxial layer deposited thereon, or a silicon structure comprising a dielectric or insulating layer, i.e., a silicon on insulator (SOI) structure. Czochralski-grown silicon typically has an oxygen concentration within the range of about $5\times10^{17}$ to about $9\times10^{17}$ atoms/cm$^3$ (ASTM standard F-121-83). Because the oxygen precipitation profile of the wafer becomes essentially decoupled from the oxygen concentration in the ideal precipitating wafer, the starting wafer may have an oxygen concentration falling anywhere within or even outside the range attainable by the Czochralski process. The oxygen concentration may however affect the growth or dissolution of oxygen precipitates once formed; that is, increased concentrations of oxygen interstitial atoms promotes the growth of oxygen precipitates and reduces the dissolution of such precipitates. Accordingly, while the oxygen concentration may be anywhere within or outside the range discussed above, without departing from the scope of the present invention, preferably the starting wafer has an oxygen concentration which is at least about $6\times10^{17}$ atoms/cm$^3$, more preferably at least about $7\times10^{17}$ atoms/cm$^3$ and even as high as about $8\times10^{17}$ atoms/cm$^3$ or greater (ASTM standard F-121-83).

Depending upon the cooling rate of the single crystal silicon ingot from the temperature of the melting point of silicon (about 1410° C.) through the range of about 750° C. to about 350° C., oxygen precipitate nucleation centers may form in the single crystal silicon ingot from which the wafer is sliced. The presence or absence of these nucleation centers in the starting material is not critical to the present invention provided, however, these centers are capable of being dissolved by heat-treating the silicon at temperatures not in excess of about 1300° C. Certain heat-treatments, such as annealing the silicon at a temperature of about 800° C. for about four hours, can stabilize these centers such that they are incapable of being dissolved at temperatures not in excess of about 1150° C. as discussed in more detail below. The detection limit for oxygen precipitates is currently about $5\times10^6$ precipitates/cm$^3$. The presence (or density) of oxygen precipitation nucleation centers cannot be directly measured using presently available techniques. Various techniques may be used, however, to indirectly detect their presence. As previously discussed, pre-existing oxygen precipitate nucleation centers in the silicon can be stabilized and precipitates can be grown at these sites by subjecting the silicon to an oxygen precipitation heat treatment. Thus, the presence of these nucleation centers can indirectly be measured after an oxygen precipitation heat treatment, e.g., annealing the wafer at a temperature of 800° C. for four hours and then at a temperature of 1000° C. for sixteen hours.

Substitutional carbon, when present as an impurity in single crystal silicon, has the ability to catalyze the formation of oxygen precipitate nucleation centers. For this and other reasons, therefore, it is preferred that the single crystal silicon starting material have a low concentration of carbon. That is, the single crystal silicon should have a concentration of carbon which is less than about $5\times10^{16}$ atoms/cm$^3$, preferably which is less than $1\times10^{16}$ atoms/cm$^3$, and more preferably less than $5\times10^{15}$ atoms/cm$^3$.

Figure 6:
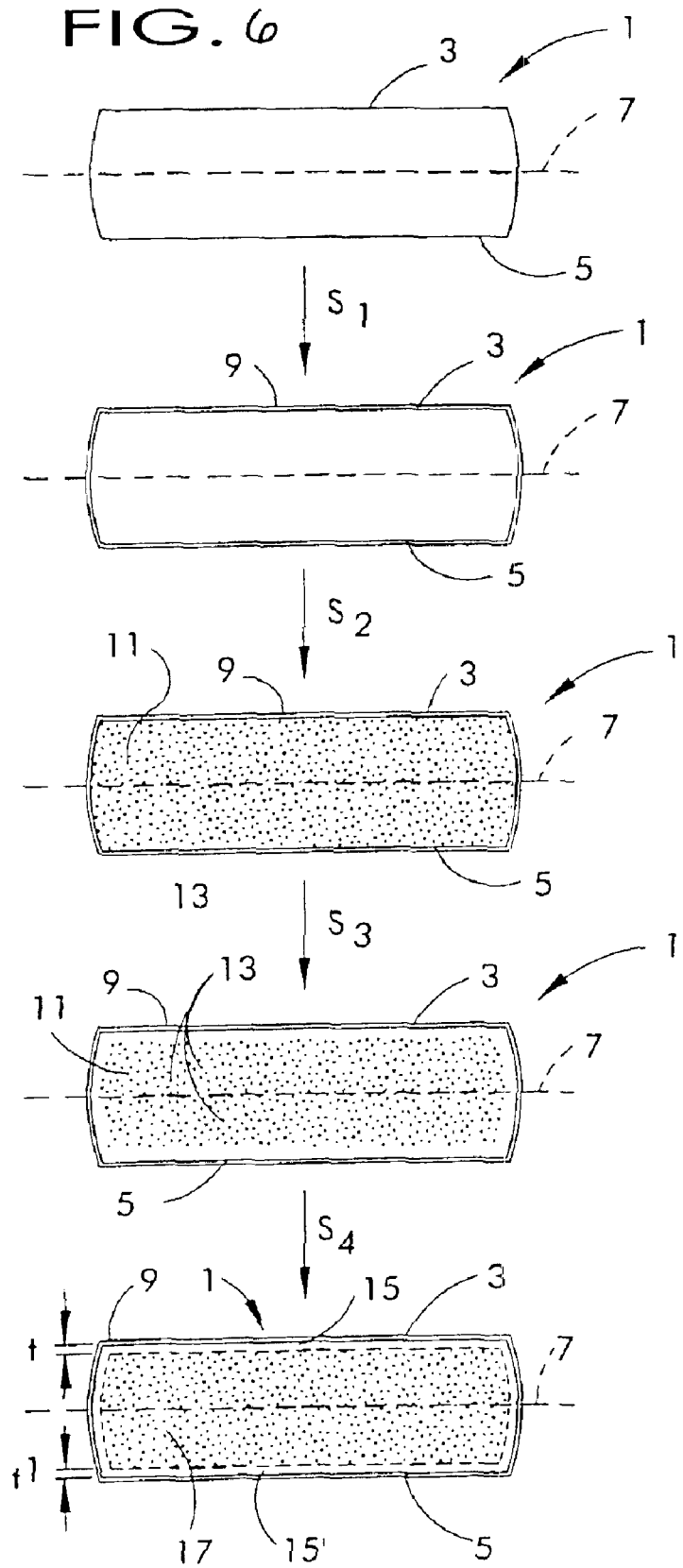
FIG. 6 is a schematic depiction of the ideal precipitating wafer process.

Referring now to FIG. 6, one starting material for the ideal precipitating wafer, or a wafer obtained from the ideal precipitating process, a single crystal silicon wafer 1, has a front surface 3, a back surface 5, and an imaginary central plane 7 between the front and back surfaces. The terms "front" and "back" in this context are used to distinguish the two major, generally planar surfaces of the wafer; the front surface of the wafer, as that term is used herein, is not necessarily the surface onto which an electronic device will subsequently be fabricated, nor is the back surface of the wafer, as that term is used herein, necessarily the major surface of the wafer which is opposite the surface onto which the electronic device is fabricated. In addition, because silicon wafers typically have some total thickness variation (TTV), warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces. It should be noted that the starting material may also be an epitaxial wafer (i.e., a silicon wafer 1, wherein an epitaxial layer has been deposited on either the front surface 3 or the back surface 5) or SOI structure wherein an insulating or dielectric layer has been deposited between either the front surface 3 and the central plane 4, or between the back surface 5 and the central plane 4.

In a first embodiment of the ideal precipitating process, wafer 1 is heat-treated in an oxygen-containing atmosphere in step $S_1$ to grow a superficial oxide layer 9 which envelopes wafer 1. In general, the oxide layer will have a thickness which is greater than the native oxide layer which forms upon silicon (about 15 Ångstroms); preferably, the oxide layer has a thickness of at least about 20 Ångstroms and, in some embodiments, at least about 25 Ångstroms or even at least about 30 Ångstroms. Experimental evidence obtained to-date, however, suggests that oxide layers having a thickness greater than about 30 Ångstroms, while not interfering with the desired effect, provide little or no additional benefit.

In step $S_2$, the wafer is subjected to a heat-treatment step in which the wafers are heated to an elevated temperature to form and thereby increase the number density of crystal lattice vacancies 13 in wafer 1. Preferably, this heat-treatment step is carried out in a rapid thermal annealer in which the wafers are rapidly heated to a target temperature and annealed at that temperature for a relatively short period of time. In general, the wafer is subjected to a temperature in excess of 1150° C., preferably at least 1175° C., more preferably at least about 1200° C., and most preferably between about 1200° C. and 1275° C.

The rapid thermal annealing step is, in one embodiment, carried out in the presence of a nitriding atmosphere; that is, an atmosphere containing nitrogen gas ($N_2$) or a nitrogen-containing compound gas such as ammonia which is capable of nitriding an exposed silicon surface. The atmosphere may thus consist entirely of nitrogen or nitrogen compound gas, or it may additionally comprise a non-nitriding gas such as argon. An increase in vacancy concentration throughout the wafer is achieved nearly, if not immediately, upon achieving the annealing temperature. The wafer will generally be maintained at this temperature for at least one second, typically for at least several seconds (e.g., at least 3), preferably for several tens of seconds (e.g., 20, 30, 40, or 50 seconds) and, depending upon the desired characteristics of the wafer, for a period which may range up to about 60 seconds (which is near the limit for commercially available rapid thermal annealers). The resulting wafer will have a relatively uniform vacancy concentration (number density) profile in the wafer.

Based upon experimental evidence obtained to-date, the atmosphere in which the rapid thermal annealing step is carried out preferably has no more than a relatively small partial pressure of oxygen, water vapor and other oxidizing gases; that is, the atmosphere has a total absence of oxidizing gases or a partial pressure of such gases which is insufficient to inject sufficient quantities of silicon self-interstitial atoms which suppress the build-up of vacancy concentrations. While the lower limit of oxidizing gas concentration has not been precisely determined, it has been demonstrated that for partial pressures of oxygen of 0.01 atmospheres (atm.), or 10,000 parts per million atomic (ppma), no increase in vacancy concentration and no effect is observed. Thus, it is preferred that the atmosphere have a partial pressure of oxygen and other oxidizing gases of less than 0.01 atm. (10,000 ppma); more preferably the partial pressure of these gases in the atmosphere is no more than about 0.005 atm. (5,000 ppma), more preferably no more than about 0.002 atm. (2,000 ppma), and most preferably no more than about 0.001 atm. (1,000 ppma).

In addition to causing the formation of crystal lattice vacancies, the rapid thermal annealing step causes the dissolution of any unstabilized oxygen precipitate nucleation centers which are present in the silicon starting material. These nucleation centers may be formed, for example, during the growth of the single crystal silicon ingot from which the wafer was sliced, or as a consequence of some other event in the previous thermal history of the wafer or of the ingot from which the wafer is sliced. Thus, the presence or absence of these nucleation centers in the starting material is not critical, provided these centers are capable of being dissolved during the rapid thermal annealing step.

The rapid thermal anneal may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.).

Intrinsic point defects (vacancies and silicon self-interstitials) are capable of diffusing through single crystal silicon with the rate of diffusion being temperature dependant. The concentration profile of intrinsic point defects, therefore, is a function of the diffusivity of the intrinsic point defects and the recombination rate as a function of temperature. For example, the intrinsic point defects are relatively mobile at temperatures in the vicinity of the temperature at which the wafer is annealed in the rapid thermal annealing step, whereas they are essentially immobile for any commercially practical time period at temperatures of as much as 700° C. Experimental evidence obtained to-date suggests that the effective diffusion rate of vacancies slows considerably at temperatures less than about 700° C. and perhaps as great as 800° C., 900° C., or even 1,000° C., the vacancies can be considered to be immobile for any commercially practical time period.

Upon completion of step $S_2$, the wafer is rapidly cooled in step $S_3$ through the range of temperatures at which crystal lattice vacancies are relatively mobile in the single crystal silicon. As the temperature of the wafer is decreased through this range of temperatures, the vacancies diffuse to the oxide layer 9 and become annihilated, thus leading to a change in the vacancy concentration profile with the extent of change depending upon the length of time the wafer is maintained at a temperature within this range. If the wafer were held at this temperature within this range for an infinite period of time, the vacancy concentration would once again become substantially uniform throughout wafer bulk 11 with the concentration being an equilibrium value which is substantially less than the concentration of crystal lattice vacancies immediately upon completion of the heat-treatment step. By rapidly cooling the wafer, however, a non-uniform distribution of crystal lattice vacancies can be achieved with the maximum vacancy concentration being at or near central plane 7 and the vacancy concentration decreasing in the direction of the front surface 3 and back surface 5 of the wafer. In general, the average cooling rate within this range of temperatures is at least about 5° C. per second and preferably at least about 20° C. per second. Depending upon the desired depth of the precipitate-free zone, the average cooling rate may preferably be at least about 50° C. per second, still more preferably at least about 100° C. per second, with cooling rates in the range of about 100° C. to about 200° C. per second being presently preferred for some applications. Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical. Conveniently, the cooling step may be carried out in the same atmosphere in which the heating step is carried out.

In step $S_4$, the wafer is subjected to an oxygen precipitation heat-treatment. For example, the wafer may be annealed at a temperature of 800° C. for four hours and then at a temperature of 1000° C. for sixteen hours. Alternatively and preferably, the wafer is loaded into a furnace which is at a temperature of about 800° C. as the first step of an electronic device manufacturing process. When loaded into a furnace at this temperature, the previously rapidly thermal annealed wafer will have separate zones which behave differently with respect to oxygen precipitation. In the high vacancy regions (the wafer bulk), oxygen clusters rapidly as the wafer enters the furnace. By the time the loading temperature is reached, the clustering process is finished and a distribution of clusters is reached which depends only upon the initial concentration of vacancies. In the low vacancy regions (near the wafer surfaces), the wafer behaves like a normal wafer which lacks pre-existing oxygen precipitate nucleation centers; that is, oxygen clustering is not observed. As the temperature is increased above 800° C. or if the temperature remains constant, the clusters in the vacancy rich zone grow into precipitates and are thereby consumed, whereas in the vacancy lean zone nothing happens. By dividing the wafer into various zones of vacancy concentration, a template is effectively created through which is written an oxygen precipitate pattern which is fixed the moment the wafer is loaded into the furnace.

As illustrated in FIG. 6, the resulting depth distribution of oxygen precipitates in the wafer is characterized by clear regions of oxygen precipitate-free material (denuded zones) 15 and 15' extending from the front surface 3 and back surface 5 to a depth t, t', respectively. Between the oxygen precipitate-free regions, 15 and 15', there is a region 17 which contains a substantially uniform density of oxygen precipitates.

The concentration of oxygen precipitates in region 17 is primarily a function of the heating step and secondarily a function of the cooling rate. In general, the concentration of oxygen precipitates increases with increasing temperature and increasing annealing times in the heating step, with precipitate densities in the range of about $1 \times 10^7$ to about $5 \times 10^{10}$ precipitates/cm$^3$ being routinely obtained.

The depth t, t' from the front and back surfaces, respectively, of oxygen precipitate-free material (denuded zones) 15 and 15' is primarily a function of the cooling rate through the temperature range at which crystal lattice vacancies are relatively mobile in silicon. In general, the depth t, t' increases with decreasing cooling rates, with precipitate-free zone depths of at least about 10, 20, 30, 40, 50, 70 or even 100 micrometers being attainable. Significantly, the depth of the precipitate-free zone is essentially independent of the details of the electronic device manufacturing process and, in addition, does not depend upon the out-diffusion of oxygen as is conventionally practiced.

While the rapid thermal treatments employed in this process of the present invention may result in the out-diffusion of a small amount of oxygen from the surface of the front and back surfaces of the wafer, the amount of out-diffusion is significantly less than what is observed in conventional processes for the formation of precipitate-free zones. As a result, the ideal precipitating wafers of the present invention have a substantially uniform interstitial oxygen concentration as a function of distance from the silicon surface. For example, prior to the oxygen precipitation heat-treatment, the wafer will have a substantially uniform concentration of interstitial oxygen from the center of the wafer to regions of the wafer which are within about 15 microns of the silicon surface, more preferably from the center of the silicon to regions of the wafer which are within about 10 microns of the silicon surface, even more preferably from the center of the silicon to regions of the wafer which are within about 5 microns of the silicon surface, and most preferably from the center of the silicon to regions of the wafer which are within about 3 microns of the silicon surface. In this context, a substantially uniform oxygen concentration shall mean a variance in the oxygen concentration of no more than about 50%, preferably no more than about 20%, and most preferably no more than about 10%.

Typically, oxygen precipitation heat-treatments do not result in a substantial amount of oxygen outdiffusion from the heat-treated wafer. As a result, the concentration of interstitial oxygen in the precipitate-free zone at distances more than several microns from the wafer surface will not significantly change as a consequence of the precipitation heat-treatment. For example, if the precipitate-free zone of the wafer consists of the region of the wafer between the surface of the silicon and a distance, $D_1$ (which is at least about 10 micrometers) as measured from the front surface and toward the central plane, the oxygen concentration at a position within the precipitate-free zone which is at a distance from the silicon surface equal to one-half of $D_1$ will typically be at least about 75% of the peak concentration of the interstitial oxygen concentration anywhere in the precipitate-free zone. For some oxygen precipitation heat-treatments, the interstitial oxygen concentration at this position will be even greater, i.e., at least 85%, 90% or even 95% of the maximum oxygen concentration anywhere in the precipitate-free zone.

In a second embodiment of the ideal precipitating wafer process, a non-nitriding atmosphere is used instead of the nitriding atmosphere used in the heating (rapid thermal annealing) and cooling steps of the first embodiment. Suitable non-nitriding atmospheres include argon, helium, neon, carbon dioxide, and other such non-oxidizing, non-nitriding elemental and compound gases, or mixtures of such gases. The non-nitriding atmosphere, like the nitriding atmosphere, may contain a relatively small partial pressure of oxygen, i.e., a partial pressure less than 0.01 atm. (10,000 ppma), more preferably less than 0.005 atm. (5,000 ppma), more preferably less than 0.002 atm. (2,000 ppma), and most preferably less than 0.001 atm. (1,000 ppma).

In a third embodiment of the ideal precipitating wafer process, step $S_1$ (the thermal oxidation step) is omitted and the starting wafer has no more than a native oxide layer. When such a wafer is annealed in a nitrogen atmosphere, however, the effect differs from that which is observed when a wafer having an oxide layer which is greater in thickness than a native oxide layer ("enhanced oxide layer") is annealed in nitrogen. When the wafer containing an enhanced oxide layer is annealed in a nitrogen atmosphere, a substantially uniform increase in the vacancy concentration is achieved throughout the wafer nearly, if not immediately, upon reaching the annealing temperature; furthermore, the vacancy concentration does not appear to significantly increase as a function of annealing time at a given annealing temperature. If the wafer lacks anything more than a native oxide layer and if the front and back surfaces of the wafer are annealed in nitrogen, however, the resulting wafer will have a vacancy concentration (number density) profile which is generally "U-shaped" for a cross-section of the wafer; that is, a maximum concentration will occur at or within several micrometers of the front and back surfaces and a relatively constant and lesser concentration will occur throughout the wafer bulk with the minimum concentration in the wafer bulk initially being approximately equal to the concentration which is obtained in wafers having an enhanced oxide layer. Furthermore, an increase in annealing time will result in an increase in vacancy concentration in wafers lacking anything more than a native oxide layer. By controlling the cooling rate of the wafer after the formation of the "U-shaped" vacancy profile, the vacancy concentration in the near surface region may be reduced resulting in an "M-shaped" concentration profile in the cooled wafer; that is, the concentration in the surface layer is such that a maximum concentration of vacancies occurs in the regions between the front surface and the central plane and between the central plane and the back surface with the concentration generally decreasing between the peak concentrations to a local minimum at or near the central plane and generally decreasing from the peak concentrations to the front and back surface.

Experimental evidence further suggests that this difference in behavior for wafers having no more than a native oxide layer and wafers having an enhanced oxide layer can be avoided by including molecular oxygen or another oxidizing gas in the atmosphere. Stated another way, when wafers having no more than a native oxide are annealed in a nitrogen atmosphere containing a small partial pressure of oxygen, the wafer behaves the same as wafers having an enhanced oxide layer. Without being bound to any theory, it appears that superficial oxide layers which are greater in thickness than a native oxide layer serve as a shield which inhibits nitridization of the silicon. This oxide layer may thus be present on the starting wafer or formed, in situ, by growing an enhanced oxide layer during the annealing step.

Accordingly, if a peak concentration at or near the central plane is desired and the wafer has no more that a native oxide layer on the surface thereof, the atmosphere during the rapid thermal annealing step preferably contains a partial pressure of at least about 0.0001 atm. (100 ppma), more preferably a partial pressure of at least about 0.0002 atm. (200 ppma). For the reasons previously discussed, however, the partial pressure of oxygen preferably does not exceed 0.01 atm. (10,000 ppma), and is more preferably less than 0.005 atm. (5,000 ppma), still more preferably less than 0.002 atm. (2,000 ppma), and most preferably less than 0.001 atm. (1,000 ppma).

In other embodiments of the present invention, the front and back surfaces of the wafer may be exposed to different atmospheres, each of which may contain one or more nitriding or non-nitriding gases. For example, the back surface of the wafer may be exposed to a nitriding atmosphere as the front surface is exposed to a non-nitriding atmosphere. Alternatively, multiple wafers (e.g., 2, 3 or more wafers) may be simultaneously annealed while being stacked in face-to-face arrangement; when annealed in this manner, the faces which are in face-to-face contact are mechanically shielded from the atmosphere during the annealing. Alternatively, and depending upon the atmosphere employed during the rapid thermal annealing step and the desired oxygen precipitation profile of the wafer, the oxide layer may be formed only upon the side of the wafer at which the precipitate-free zone is desired, e.g., front surface 3 of the wafer (see FIG. 1).

The starting material for the ideal precipitating wafer process may be a polished silicon wafer, or alternatively, a silicon wafer which has been lapped and etched but not polished. In addition, the wafer may have vacancy or self-interstitial point defects as the predominant intrinsic point defect. For example, the wafer may be vacancy dominated from center to edge, self-interstitial dominated from center to edge, or it may contain a central core of vacancy of dominated material surrounded by an axially symmetric ring of self-interstitial dominated material.

The measurement of crystal lattice vacancies in single crystal silicon can be carried out by platinum diffusion analysis. In general, platinum is deposited on the samples and diffused in a horizontal surface with the diffusion time and temperature preferably being selected such that the Frank-Turnbull mechanism dominates the platinum diffusion, but which is sufficient to reach the steady-state of vacancy decoration by platinum atoms. For wafers having vacancy concentrations which are typical for the present invention, a diffusion time and temperature of 730° C. for 20 minutes may be used, although more accurate tracking appears to be attainable at a lesser temperature, e.g., about 680° C. In addition, to minimize a possible influence by silicidation processes, the platinum deposition method preferably results in a surface concentration of less than one monolayer. Platinum diffusion techniques are described elsewhere, for example, by Jacob et al., *J. Appl. Phys.*, vol. 82, p. 182 (1997); Zimmermann and Ryssel, "The Modeling of Platinum Diffusion In Silicon Under Non-Equilibrium Conditions," *J. Electrochemical Society*, vol. 139, p. 256 (1992); Zimmermann, Goesele, Seilenthal and Eichiner, "Vacancy Concentration Wafer Mapping In Silicon," *Journal of Crystal Growth*, vol. 129, p. 582 (1993); Zimmermann and Falster, "Investigation Of The Nucleation of Oxygen Precipitates in Czochralski Silicon At An Early Stage," *Appl. Phys. Lett.*, vol. 60, p. 3250 (1992); and Zimmermann and Ryssel, *Appl. Phys. A*, vol. 55, p. 121 (1992).

III. Oxygen Precipitate Nucleation and Stabilization

In general, the ideal precipitating heat-treatment may be carried out before or after the epitaxial deposition and/or ion implantation step(s). Significantly, the epitaxial deposition and/or the ion implantation (in particular the ion implantation thermal anneal), can affect the vacancy profile formed during the ideal precipitating heat treatment. Accordingly, it is preferred that oxygen precipitates are grown and stabilized according to the vacancy profile after the ideal precipitating wafer process, and prior to subsequent epitaxial deposition and/or ion implantation, in particular the ion implantation thermal anneal step(s), such that they survive the epitaxial deposition or ion implantation process.

The oxygen precipitates may be grown and stabilized by subjecting the wafer to an oxygen precipitation and stabilization heat-treatment wherein the wafer is heated to a temperature and for a time period sufficient for the oxygen interstitial atoms to diffuse, agglomerate at vacancy cites and to grow to form oxygen precipitates of sufficient size to survive the epitaxial deposition process. A heat treatment of 2 to 4 hours at a temperature of 800° C. is generally found to be sufficient to allow the oxygen atoms to diffuse and combine at vacancies to form oxygen precipitate nuclei that are stable at epitaxial process temperatures of 1150° C. The time and duration of the stabilization may be increased or decreased to grow the oxygen precipitates such that they are capable of surviving higher temperature annealing steps such as the ion implantation anneal.

The process for precipitating oxygen and growing the precipitates to a critical size sufficient to survive the epitaxial deposition or ion implantation anneal is mostly limited by the diffusion rate of the oxygen interstitial atoms. In a simple, diffusion limited growth model, the precipitate radius, R, after heat-treatment for time t at a temperature T is given by:

$$R=[W_{ox} \times (C_i - C_1^*) \times D(T) \times t]^{1/2} \quad (1)$$

wherein: $C_i$ is the initial interstitial oxygen concentration; $C_1^*$ is the equilibrium interstitial oxygen concentration at temperature T; $W_{ox}$ is the volume of an $SiO_2$ molecule; $D(T)$ is the diffusivity of interstitial oxygen in Si at temperature T; and, t is the heat-treatment time at temperature T. (*Semiconductors and Semimetals, Vol. 42, Oxygen in Silicon*, ed. F. Shimura, Academic Press, 1994, p. 367). Thus, for a given interstitial oxygen concentration, the precipitate radius is proportional to the diffusion length, $L_{diff}$, given by:

$$L_{diff.}=(D(T) \times t)^{1/2} \quad (2)$$

wherein $D(T)$ and t are as defined above. The diffusivity of interstitial oxygen, $D(T)$, is calculated by the equation:

$$D(T)=(7.8 \times 10^8 \ mm^2/min)(e^{-29,333/T}) \quad (3)$$

wherein T is the heat-treatment temperature in degrees Kelvin and $D(T)$ has the units $mm^2/min$.

To survive the high temperature epitaxial deposition process, the oxygen precipitate radius, R, must be greater than a critical radius, $R_c$. Thus, a critical diffusion length, $L_c$, required to form and stabilize the oxygen precipitates may be determined such that for a given heat-treatment temperature, the time period required to allow the oxygen interstitial atoms to diffuse and combine to form oxygen precipitates and grow to a size sufficient to survive the epitaxial process may be calculated; that is, the critical diffusion length may be determined by the equation:

$$L_c=(D(T) \times t_{min})^{1/2}=R_c/[W_{ox} \times (C_1-C_1^*)]^{1/2} \quad (4)$$

wherein: $L_c$ is the critical diffusion length in microns; $D(T)$ is the interstitial oxygen diffusivity having the units $mm^2/min$; and, $t_{min}$ is the minimum heat-treatment time, in minutes, required to grow and stabilize the oxygen precipitates. Thus, from equations (1) through (4), the minimum time, $t_{min}$, required to grow and stabilize oxygen precipitates for a given heat-treatment temperature can be calculated as a function of the heat treatment temperature, and the critical diffusion length according to the following equation:

$$t_{min}=L_c^2/[(7.8 \times 10^8 \ mm^2/min)(e^{-29,333/T})] \quad (5)$$

Preliminary experimental data suggest that the critical diffusion length required to grow and stabilize oxygen precipitates, such that they survive an epitaxial process, is about 0.5 mm; that is, ideal precipitating wafers subjected to a heat-treatment temperature of about 800° C. for about 4 hours contained a concentration of oxygen precipitates having a concentration profile corresponding to the vacancy profile, such that the precipitates were capable of surviving an epitaxial deposition process. The diffusion length for oxygen interstitial atoms in a wafer heated to about 800° C. for about 4 hours is about 0.5 mm, as determined by the equations (2) and (3) above. Thus, the preferred time period at which an ideal precipitating wafer is maintained at a particular heat-treatment temperature may be determined from equation (5) assuming a critical diffusion length of at least about 0.5 mm. Accordingly, when using a heat-treatment temperature of about 750° C., the wafer is preferably maintained at that temperature for about 5 hours; when using a heat-treatment temperature of about 800° C., the wafer is preferably maintained at that temperature for about 4 hours; when using a heat-treatment temperature of about 850° C., the wafer is preferably maintained at that temperature for about 1 hour; and, when using a heat-treatment temperature of at least about 900° C., the wafer is preferably maintained at that temperature for about 0.2 hours.

Although the rate at which the temperature of the wafer is increased is not critical to the present invention, at temperatures above about 825° C., the heating rate must be slow enough to allow oxygen atoms to diffuse to and agglomerate on the vacancy sites before the temperature becomes high enough to allow the vacancy profile to diffuse away. Accordingly, it is preferred that above about 800° C. the temperature of the wafer is increased at a rate of about 5° C./min to about 30° C./min. The total diffusion length of the heat treatment process including the ramp up from 750° C. to the desired heat treatment temperature, and the corresponding ramp down to 750° C., can be determined by calculating the approximate diffusion length for each portion of the heat-treatment process using equations (2) and (3), and numerical or series expansion methods to integrate equations (2) and (3) for the temperature ramping portions of the heat treatment. The diffusion lengths for the individual portions of the heat treatment may then be added in quadrature to obtain the total diffusion length. For example, in one embodiment of the present invention, the temperature of the ideal precipitating wafer is increased from about 750° C. to about 850° C. at a rate of about 10° C./min, held at 850° C. for about 1.1 hours, and decreased to 750° C. at a rate of about 10° C./min. As shown in Table I, the total cumulative diffusion length is about 0.512 µm. In another embodiment, the temperature of the ideal precipitating wafer is increased from about 750° C. to about 900° C. at a rate of about 10° C./min, held at 900° C. for about 0.25 hours, and decreased to 750° C. at a rate of about 10° C./min. As shown in Table II, the total cumulative diffusion length is 0.508 µm. Similarly, various combinations of ramp rates, heat-treatment temperatures, and hold times, can be selected using equations (1) and (2) such that the resulting total diffusion length is at least about 0.5 µm, to provide sufficient time to precipitate oxygen according to the vacancy profile, and stabilize the oxygen precipitates.

It should be noted that ion implantation anneal processes typically require heating the wafer to a temperature of from about 1,100° C. to about 1,400° C. for a duration ranging from about 0.1 hour to about 12 hours. The oxygen precipitates may need to be grown significantly larger to survive the ion implantation anneal than is typically required to survive an epitaxial deposition; that is, the oxygen precipitates are preferably grown such that the average cross-sectional area if the precipitates is at least about 40 nm, more preferably at least about 50 nm, and even at least about 60 nm or greater.

The critical diffusion length required to grow and stabilize oxygen precipitates such that they survive an ion implantation anneal at higher temperatures may be experimentally determined; that is, ideal precipitating wafers may be subjected to varying stabilization conditions (i.e., heat-treatment temperatures and durations), subjected to an ion implantation anneal, and analyzed to determine the resulting concentration of oxygen precipitates to determine whether the precipitates were capable of surviving an ion implantation annealing. The diffusion length for oxygen interstitial atoms in a wafer heated to the stabilization conditions required to survive the ion implantation anneal may then be inserted into equations (2) and (3) above to determine the critical diffusion length.

Preferably, the oxygen precipitates are grown to a size sufficient to cause the formation of secondary defects such as prismatic dislocation loops or tangles or stacking faults. Advantageously, wafers wherein the oxygen precipitates have been grown to a size sufficient to cause secondary defects retain their intrinsic gettering ability even if the oxygen precipitates are subsequently dissolved; that is, secondary defects act as intrinsic gettering sites independent of the oxygen precipitates. Thus, if a waver having secondary defects is subjected to a heat treatment such that all of the existing oxygen precipitates are dissolved, the wafer will still have intrinsic gettering capabilities.

In general, these secondary defects may be formed by heating the wafer to a temperature of at least about 800° C., preferably at least about 900° C., and more preferably at least about 1000° C. or greater and maintained at the heat treatment temperature for a duration of at least about 2 hours, more preferably at least about 4 hours, at least about 8 hours or even as long as about 16 hours or greater, with the duration of the heat treatment typically being increased for lower heat treatment temperatures and decreased for higher heat treatment temperatures. The presence of secondary defects, such as prismatic dislocation loops or tangles or stacking faults, may be determined using standard defect detection methods such as, for example, Transmission Electron Microscopy (TEM).

Finally, as noted previously, the initial oxygen concentration effects the growth rate of oxygen precipitates such that wafers having higher initial oxygen concentrations tend to form larger oxygen precipitates. Accordingly, in application wherein particularly large oxygen precipitates are desired, the initial oxygen concentration is preferably at least about $6 \times 10^{17}$ atoms/cm$^3$, more preferably at least about $7 \times 10^{17}$ atoms/cm$^3$, and even as high as about $8 \times 10^{17}$ atoms/cm$^3$ or greater (ASTM standard F-121-83).

TABLE I

| Process Step | Time (hr) | Diffusion Length (μm) | Cum. Diffusion Length (μm) |
| --- | --- | --- | --- |
| ramp from 750° C. to 850° C. at 10° C./min | 0.167 | 0.117 | 0.117 |
| hold for 1.1 hr @ 850° C. | 1.1 | 0.484 | 0.498 |
| ramp from 850° C. to 750° C. at 10° C./min | 0.167 | 0.117 | 0.512 |
| total time = | 1.433 | | |

TABLE II

| Process Step | Time (hr) | Diffusion Length (μm) | Cum. Diffusion Length (μm) |
| --- | --- | --- | --- |
| ramp from 750° C. to 900° C. at 10° C./min | 0.250 | 0.22 | 0.22 |
| hold for 0.25 hr @ 900° C. | 2.25 | 0.402 | 0.458 |
| ramp from 900° C. to 750° C. at 10° C./min | 0.250 | 0.22 | 0.508 |
| total time = | 0.750 | | |

IV. Epitaxial Deposition

The epitaxial layer may be deposited onto the entire wafer, or, alternatively, onto only a portion of the wafer. Referring again to FIG. 6, the epitaxial layer preferably is deposited onto the front surface 3 of the wafer 1. In a particularly preferred embodiment, it is deposited onto the entire front surface 3 of the wafer. Whether it is preferred to have an epitaxial layer deposited onto any other portion of the wafer will depend on the intended use of the wafer. For most applications, the existence or non-existence of an epitaxial layer on any other portion of the wafer is not critical.

Single crystal silicon wafers sliced from ingots prepared by the Cz method often have COPs on their surfaces. A wafer used for integrated circuit fabrication, however, generally is required to have a surface which consists essentially of no COPs. A wafer having an essentially COP-free surface may be prepared by depositing an epitaxial silicon layer onto the surface of the wafer. Such an epitaxial layer fills in the COPs and ultimately produces a smooth wafer surface. This has been the topic of recent scientific investigations. (See, e.g., Schmolke et al., The Electrochem. Soc. Proc., vol. PV98-1, p. 855 (1998); and, Hirofumi et al., Jpn. J. Appl. Phys., vol. 36, p. 2565 (1997); both of which are incorporated herein by reference.) Applicants have discovered in accordance with this invention that COPs on a wafer surface may be eliminated by using an epitaxial silicon layer thickness of at least about 0.1 μm. Preferably, the epitaxial layer has a thickness of at least about 0.1 μm and less than about 2 μm. More preferably, the epitaxial layer has a thickness of from about 0.25 to about 1 μm, and most preferably from about 0.65 to about 1 μm.

It should be noted that the preferred thickness of the epitaxial layer may vary if the epitaxial layer is used to impart electrical properties to the wafer surface in addition to eliminating COPs. For example, precise control of a dopant concentration profile near the wafer surface may be achieved using an epitaxial layer. Where an epitaxial layer is used for a purpose in addition to eliminating COPs, such a purpose may require an epitaxial layer thickness which is greater than the preferred thickness used to eliminate the COPs. In such an instance, the minimum thickness to achieve the additional desired effect preferably is used. Depositing a thicker layer onto the wafer is generally less commercially desirable because forming the thicker layer requires a greater deposition time and more frequent cleaning of the reaction vessel.

If a wafer has a silicon oxide layer (e.g., a native silicon oxide layer, which forms on a silicon surface when it is exposed to air at room temperature and generally has a thickness of from about 10 to about 15 Å, or an oxide layer deposited as part of the ideal precipitating wafer process) on its surface, the silicon oxide layer preferably is removed from the surface of the wafer before the epitaxial layer is deposited onto the surface. As used herein, the phrase "silicon oxide layer" refers to a layer of silicon atoms which are chemically bound to oxygen atoms. Typically, such a silicon oxide layer contains about 2 oxygen atoms per silicon atom.

In a preferred embodiment of this invention, removal of the silicon oxide layer is preferably accomplished by heating the surface of the wafer in an atmosphere consisting essentially of no oxidants (most preferably, the atmosphere is oxidant-free) until the silicon oxide layer is removed from the surface. In a particularly preferred embodiment, the surface of the wafer is heated to a temperature of at least about 1100° C., and more preferably to a temperature of at least about 1150° C. This heating preferably is conducted while exposing the surface of the wafer to an atmosphere comprising a noble gas (e.g., He, Ne, or Ar), $H_2$, HF, HCl gas, or a combination thereof. More preferably, the atmosphere comprises HF gas, HCl gas, $H_2$, or a combination thereof; atmospheres comprising a noble gas tend to cause pits to form in the surface of the wafer. Most preferably, the atmosphere consists essentially of $H_2$. It should be noted that although atmospheres containing $N_2$ may be used, such atmospheres are less preferred because they tend to form nitrides on the surface which interfere with subsequent epitaxial deposition on the surface.

Traditionally, the epitaxial deposition protocols that remove a silicon oxide layer by heating a wafer in the presence of $H_2$ require the wafer to be heated to a high temperature (e.g., from about 1000 to about 1250° C.) and then baked at that temperature for a period of time (i.e., typically from about 10 to about 90 seconds). It has been discovered in accordance with this invention, however, that if the surface of the wafer is heated to about 1100° C. (and more preferably, about 1150° C.) in an atmosphere comprising $H_2$, the silicon oxide layer is removed without the subsequent bake step, thereby rendering the bake step unnecessary. Elimination of the bake step shortens the time required to prepare the wafer and, therefore, is commercially desirable.

In a preferred embodiment of this invention, the wafer surface is heated to remove the silicon oxide layer, and then the surface is exposed to an atmosphere containing silicon to deposit the epitaxial layer onto the surface. More preferably, the surface is exposed with the atmosphere containing silicon less than 30 seconds after the silicon oxide is removed, more preferably within about 20 seconds after the silicon oxide layer is removed, and most preferably within about 10 seconds after the silicon oxide layer is removed. In a particularly preferred embodiment, the wafer surface is heated to a temperature of at least about 1100° C. (more preferably, at least about 1150° C.), and then is exposed to an atmosphere containing silicon less than 30 seconds after the wafer surface reaches that temperature. More preferably, the surface is exposed to the atmosphere containing silicon within 20 seconds after the wafer surface reaches that temperature, and most preferably less within 10 seconds after the wafer surface reaches that temperature. Waiting to initiate silicon deposition for about 10 seconds after removal of the silicon oxide layer allows the temperature of the wafer to stabilize and become uniform.

During the removal of the silicon oxide layer, the wafer preferably is heated at a rate which does not cause slip. More specifically, if the wafer is heated too quickly, a thermal gradient will develop which will create an internal stress sufficient to cause different planes within the wafer to shift relative to each other (i.e., slip). Lightly doped wafers (e.g., a wafer doped with boron and having a resistivity of about 1 to about 10 Ω-cm) have been found to be particularly susceptible to slip. To avoid this problem, the wafer preferably is heated from room temperature to the silicon oxide removal temperature at an average rate of about 20 to about 35° C./seconds.

The epitaxial deposition preferably is carried out by chemical vapor deposition. Generally speaking, chemical vapor deposition involves exposing the surface of the wafer to an atmosphere comprising silicon in an epitaxial deposition reactor, e.g., an EPI CENTURA® reactor (Applied Materials, Santa Clara, Calif.). In a preferred embodiment of this invention, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (most preferably $H_2$). In one embodiment, the source of silicon during the epitaxial deposition is $SiH_2Cl_2$ or $SiH_4$. If $SiH_2Cl_2$ is used, the reactor pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air leaking into the reactor chamber is lessened.

During the epitaxial deposition, the temperature of the wafer surface preferably is maintained at a temperature sufficient to prevent the atmosphere comprising silicon from depositing polycrystalline silicon onto the surface. Generally, the temperature of the surface during this period preferably is at least about 900° C. More preferably, the temperature of the surface is maintained at from about 1050 to about 1150° C. Most preferably, the temperature of the surface is maintained at the silicon oxide removal temperature.

The rate of growth of the epitaxial deposition preferably is from about 3.5 to about 4.0 μm/min when the deposition is conducted under atmospheric pressure. This may be achieved, for example, by using an atmosphere consisting essentially of about 2.5 mole % $SiHCl_3$ and about 97.5 mole % $H_2$ at a temperature of about 1150° C.

If the intended use of the wafer requires that the epitaxial layer include a dopant, the atmosphere comprising silicon also preferably contains the dopant. For example, it is often preferable for the epitaxial layer to contain boron. Such a layer may be prepared by, for example, including $B_2H_6$ in the atmosphere during the deposition. The mole fraction of $B_2H_6$ in the atmosphere needed to obtain the desired properties (e.g., resistivity) will depend on several factors, such as the amount of boron out-diffusion from the particular substrate during the epitaxial deposition, the quantity of P-type dopants and N-type dopants that are present in the reactor and substrate as contaminants, and the reactor pressure and temperature. Applicants have successfully used an atmosphere containing about 0.03 ppm of $B_2H_6$ (i.e., about 0.03 mole of $B_2H_6$ per 1,000,000 moles of total gas) at a temperature of about 1125° C. and a pressure of about 1 atm. to obtain an epitaxial layer having a resistivity of about 10 Ω-cm.

Once an epitaxial layer having the desired thickness has been formed, the atmosphere comprising silicon preferably is purged from the reaction chamber with a noble gas, $H_2$, or a combination thereof; and more preferably with $H_2$ alone. Afterward, the wafer preferably is cooled to a temperature of no greater than about 700° C. and then removed from the epitaxial deposition reactor.

Conventional epitaxial deposition protocols typically include a cleaning step following epitaxial deposition to remove byproducts formed during the epitaxial deposition. This step is used to prevent time-dependent haze, which results if such byproducts react with air. In addition, this step typically forms a silicon oxide layer on the epitaxial surface which tends to passivate (i.e., protect) the surface. Conventional post-epitaxial-deposition cleaning methods entail, for example, immersing the epitaxial surface in any of a number of cleaning solutions which are well-known to those of ordinary skill in the art. These solutions include, for example, piranha mixtures (i.e., mixtures of sulfuric acid and hydrogen peroxide), SC-1 mixtures (i.e., mixtures of $H_2O$, $H_2O_2$, and $NH_4OH$, also known as "RCA standard clean 1"), and SC-2 mixtures (i.e., mixtures of $H_2O$, $H_2O_2$, and HCl, also known as "RCA standard clean 2"). (See, e.g., W. Kern, "The Evolution of Silicon Wafer Cleaning Technology," J. Electrochem. Soc., Vol. 137, No. 6, 1887-92 (1990).) Many such post-epitaxial-deposition cleaning steps require expensive wet cleaning equipment, large volumes of ultra-pure chemicals, additional wafer handling which often leads to additional yield losses V. Preparation of SOI Structures A SOI structure having an "ideal precipitating" handle layer or wafer may be obtained by subjecting a silicon wafer to an ideal precipitating wafer process and implanting an dielectric layer, such as silicon dioxide or silicon nitride beneath the surface of the wafer using an ion implantation process. Preferably, molecular oxygen ions ($O_2^+$) or atomic oxygen ions ($O^+$) are implanted below the surface of the wafer to form an oxide layer approximately about 0.05 $\mu$m to about 0.5 $\mu$m beneath the surface of the wafer, the oxide layer having a thickness of from about 0.05 $\mu$m to about 0.5 $\mu$m. This process is generally referred to as SIMOX (i.e., separation by implantation of oxygen; see, e.g., U.S. Pat. No. 5,436,175 and *Plasma Immersion Ion Implantation For Semiconductor Processing*, Materials Chemistry and Physics 46 (1996) 132–139, both of which are incorporated herein by reference.)

Generally, the implanted wafer will be subjected to a thermal anneal to repair damage to the devise layer and to redistribute the implanted oxygen as it chemically bonds with the silicon to form a silicon dioxide ($SiO_2$) layer. The temperature of the thermal anneal is typically from about 1,100° C. to about 1,400° C., and preferably from about 1,300° C. to about 1,350° C., and more preferably about 1,300° C. The duration of the thermal anneal is typically about 0.1 hour to about 12 hours, more preferably about 6 hours, and may vary depending on the desired characteristics of both the device layer and the dielectric layer. Preferably, the SOI structure will further comprise a device layer comprising an epitaxial layer. The epitaxial layer may be deposited on the surface of substrate prior to or after either subjecting the wafer to the ideal precipitating wafer process or implanting the dielectric layer.

The precise order in which the various steps of the present invention are performed may be varied without departing from the scope of the present invention. For example, according to one embodiment of the present invention, an epitaxial layer is first deposited on the surface of a silicon wafer to form an epitaxial wafer. The epitaxial wafer is then subjected to an ideal precipitating heat-treatment to produce an ideal precipitating epitaxial wafer. The ideal precipitating epitaxial wafer is then subjected to an ion implantation process and a thermal anneal to cause the formation of a dielectric layer beneath the surface of the wafer to produce a silicon on oxide (SOI) structure wherein the device layer comprises an epitaxial layer, and the handle layer comprises a non-uniform distribution of vacancies.

In another embodiment of the present invention, a silicon wafer is first subjected to an ideal precipitating heat-treatment to produce an ideal precipitating wafer. An epitaxial layer is then deposited on the surface of the ideal precipitating wafer. The ideal precipitating epitaxial wafer is then subjected to an ion implantation process and a thermal anneal to cause the formation of an dielectric layer beneath the surface of the wafer to produce a SOI structure wherein the device layer comprises an epitaxial layer, and the handle layer comprises a non-uniform distribution of vacancies.

In still another embodiment, a silicon wafer is subjected to an ion implantation process to produce a SOI structure having a device layer, a handle layer, and a dielectric layer separating the device layer and the handle layer. The SOI structure is then subjected to an ideal precipitation heat treatment to produce an ideal precipitating SOI structure wherein the handle layer comprises a non-uniform distribution of vacancies.

In still another embodiment, a silicon wafer is subjected to an ion implantation process to produce a SOI structure having a device layer, a handle layer, and a dielectric layer separating the device layer and the handle layer. The SOI structure is then subjected to an ideal precipitation heat treatment to produce an ideal precipitating SOI structure. An epitaxial layer is then deposited on the surface of the device layer or alternatively, the epitaxial layer may be deposited on the SOI structure prior to subjecting the SOI structure to an ideal precipitating wafer process to produce and SOI structure wherein the device layer comprises an epitaxial layer, and the handle layer comprises a non-uniform distribution of vacancies.

It should be noted that in each embodiment of the present invention, the ideal precipitation heat-treatment may include an oxygen precipitation and stabilization treatment as described above. Preferably, the oxygen precipitation and stabilization treatment is sufficient to cause the formation of secondary defects. In particular, it is preferred that the ideal precipitation heat treatment includes an oxygen precipitation and stabilization treatment when performed prior to either the epitaxial deposition and/or the ion implantation step(s). In addition, it should be noted that the thermal anneal following the ion implantation may be performed prior to or after subsequent ideal precipitating heat-treatment and/or epitaxial deposition step(s) without departing from the scope of the present invention. That is, the ion implantation step may be performed prior to the ideal precipitation heat treatment and/or epitaxial deposition and the thermal anneal following the ion implantation may be performed after the ideal precipitation heat treatment and/or epitaxial deposition.

In view of the above, it will be seen that the several objects of the invention are achieved. As various changes could be made in the above-described process without departing from the scope of the invention, it is intended that all matters contained in the above description be interpreted as illustrative and not in a limiting sense. In addition, when introducing elements of the present invention or the preferred embodiment(s) thereof, the articles "a," "an," "the" and "said" are intended to mean that there are one or more of the elements. The terms "comprising," "including" and "having" are intended to be inclusive and mean that there may be additional elements other than the listed elements.

EXAMPLES

Examples 1 through 4 illustrate the ideal oxygen precipitation process of the present invention. These Examples should, therefore, not be interpreted in a limiting sense.

Example 1

Silicon single crystals were pulled by the Czochralski method, sliced and polished to form silicon wafers. These wafers were then subjected to a surface oxidation step ($S_1$), rapid thermal annealing step in nitrogen or argon ($S_2$), rapidly cooled ($S_3$), and subjected to an oxygen stabilization and growth step ($S_4$) under the conditions set forth in Table III. The initial oxygen concentration of the wafers ($O_i$) before steps $S_1$–$S_4$, the oxygen precipitate density in the bulk of the wafers after step $S_4$ (OPD), and the depth of the precipitate-free zone after step $S_4$ (DZ) are also reported in Table III.

TABLE III

| Sample | 4–7 | 4–8 | 3–14 |
|---|---|---|---|
| $S_1$ | 15 min at 1,000° C. in $N_2$ + ~1% $O_2$ | 15 min at 1,000° C. in $N_2$ + ~1% $O_2$ | none |
| $S_2$ | 35 seconds at 1250° C. in $N_2$ | 35 seconds at 1250° C. in Ar | 35 seconds at 1250° C. in $N_2$ |
| $S_3$ | 100° C./sec | 100° C./sec | 100° C./sec |
| $S_4$ | 4 hr at 800° C. + 16 hr at 1,000° C. in $N_2$ | 4 hr at 800° C. + 16 hr at 1,000° C. in $N_2$ | 4 hr at 800° C. + 16 hr at 1,000° C. in $N_2$ |
| $O_i$ (atoms/cm$^3$) | $7 \times 10^{17}$ | $6.67 \times 10^{17}$ | $7.2 \times 10^{17}$ |
| OPD (atoms/cm$^3$) | $1 \times 10^{10}$ | $4.4 \times 10^9$ | $1.69 \times 10^{10}$ |
| DZ (depth in μm) | 70 | 95 | 0 |

Figure 7:
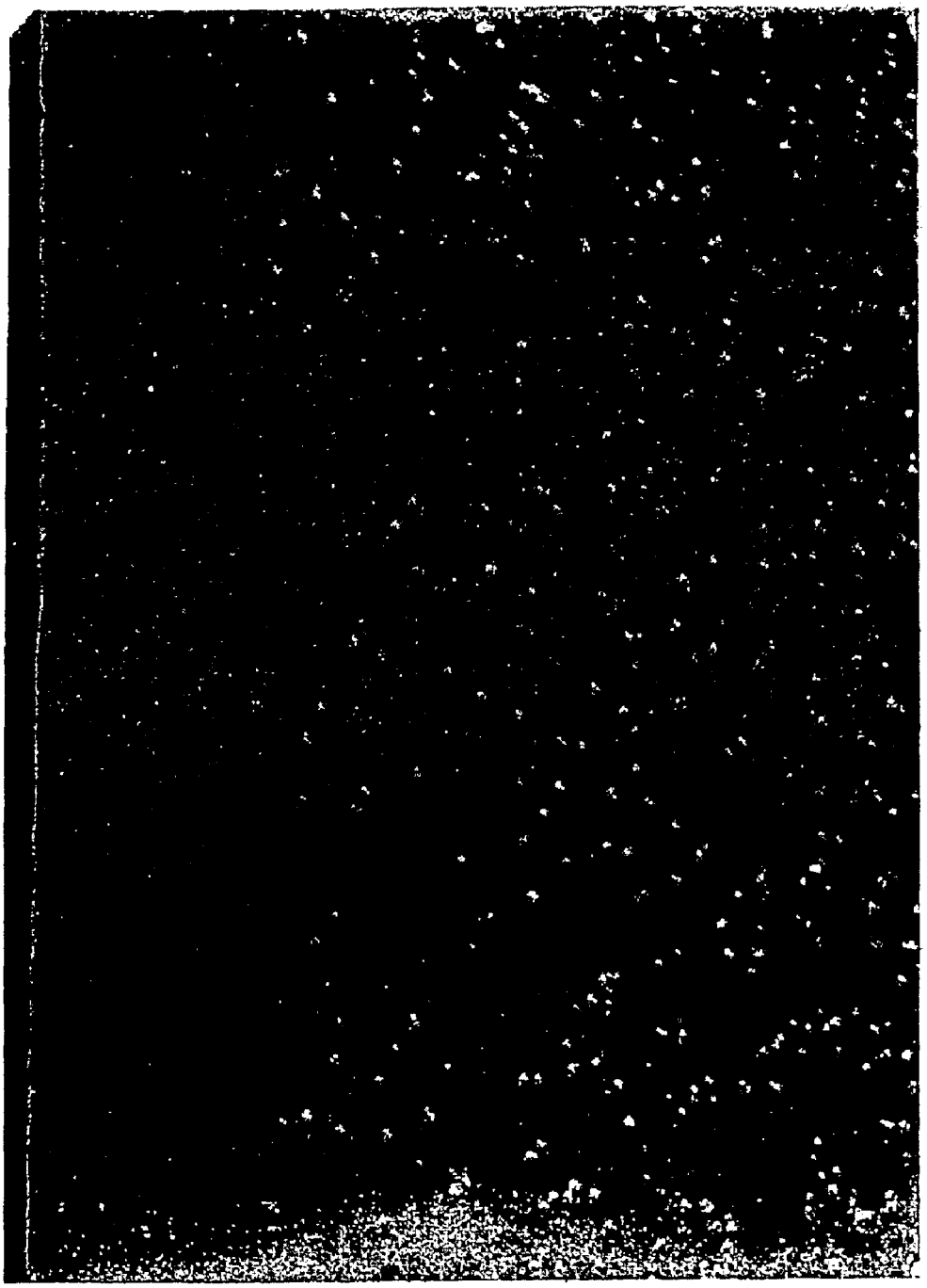
FIG. 7 is a photograph of a cross-section of a wafer (sample 4–7) which was processed as described in Example 1.
Figure 8:
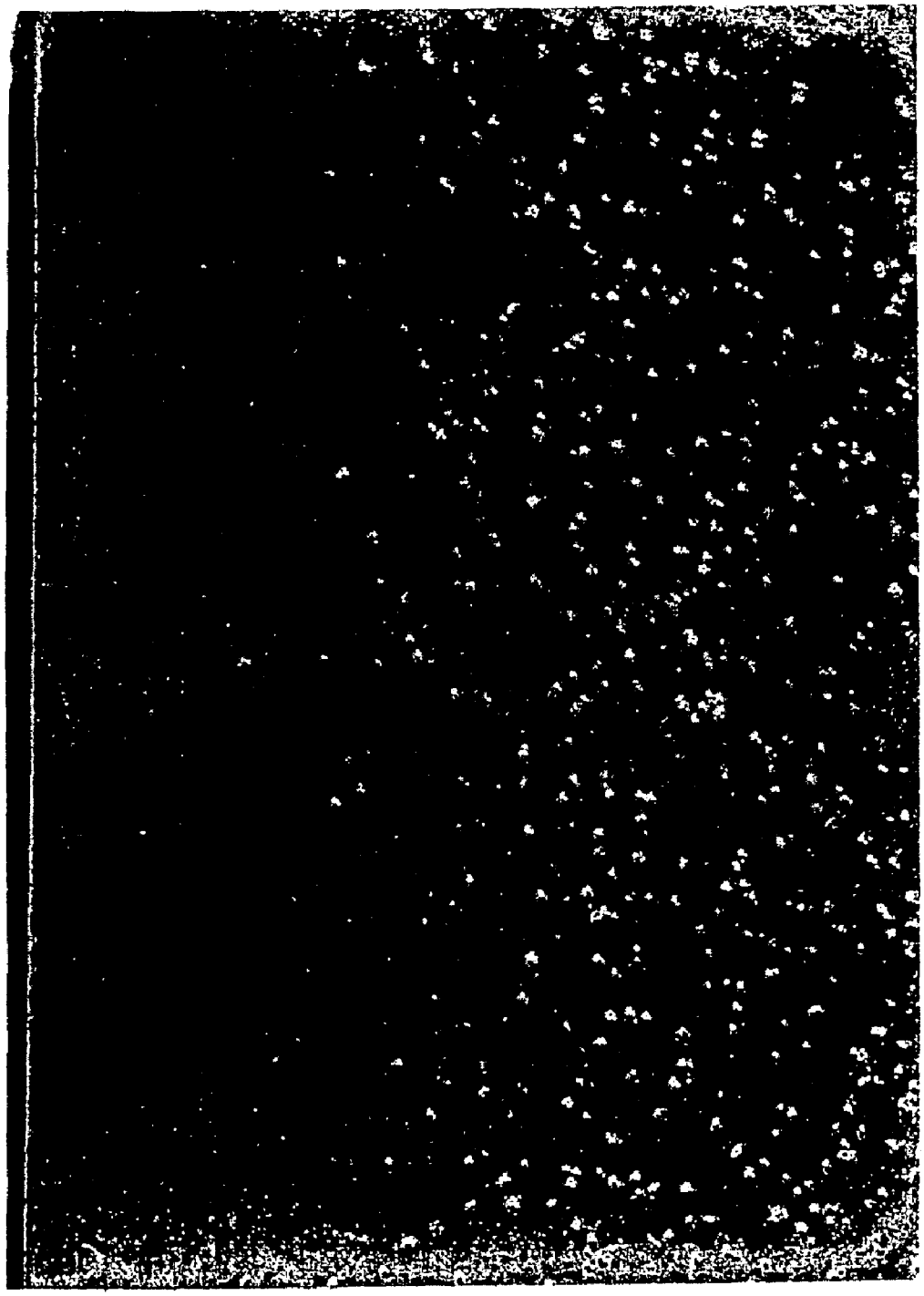
FIG. 8 is a photograph of a cross-section of a wafer (sample 4–8) which was subjected to the series of steps described in Example 1.
Figure 9:
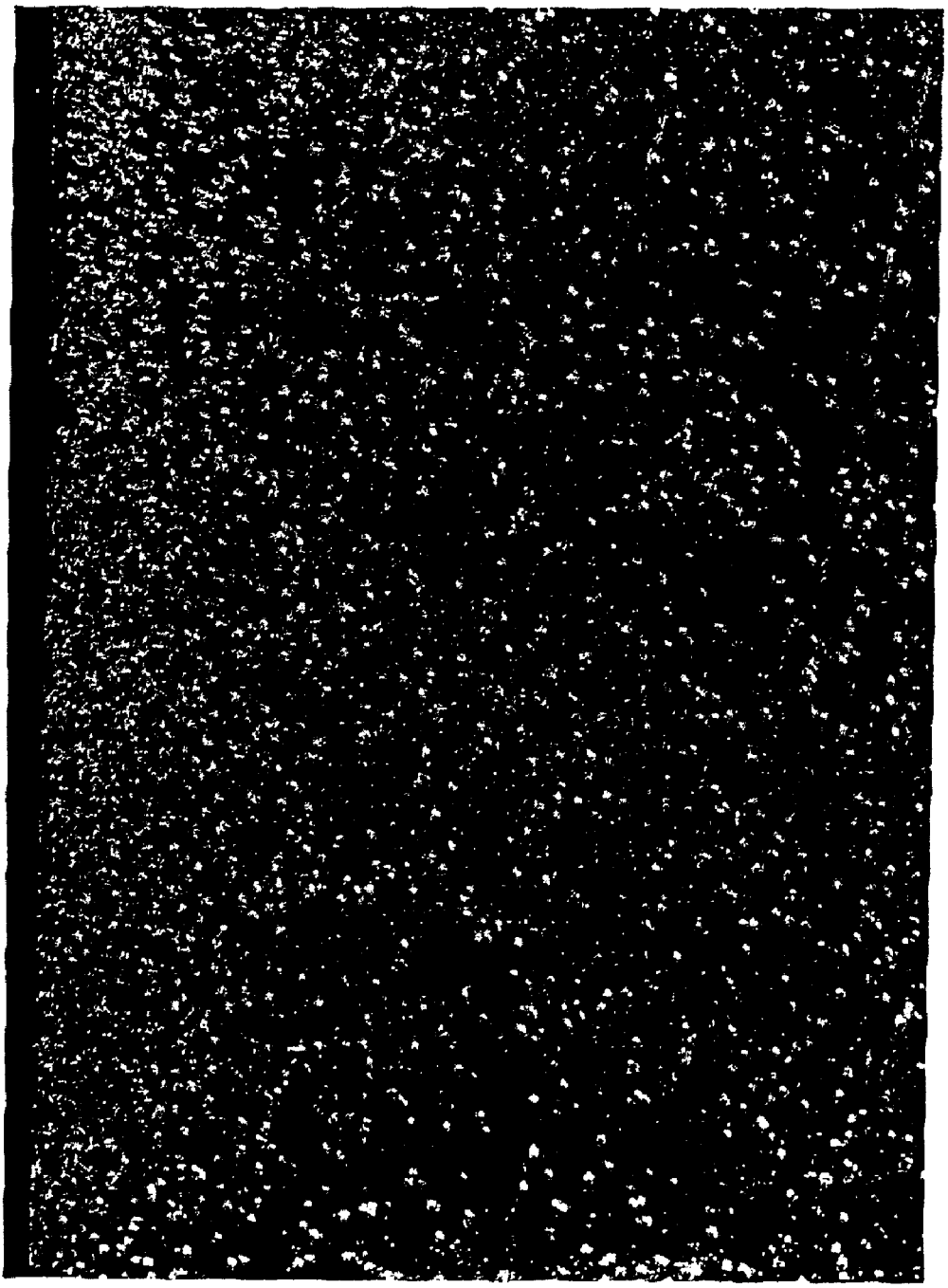
FIG. 9 is a photograph of a cross-section of a wafer (sample 3–14) which was subjected to the series of steps described in Example 1.

FIGS. 7, 8, and 9 show cross-sections of the resulting wafers (these figures are enlargements of photographs taken at a magnification of 200×); sample 4–7 is shown in FIG. 7, sample 4–8 is shown in FIG. 8, and sample 3–14 is shown in FIG. 9.

Figure 10:
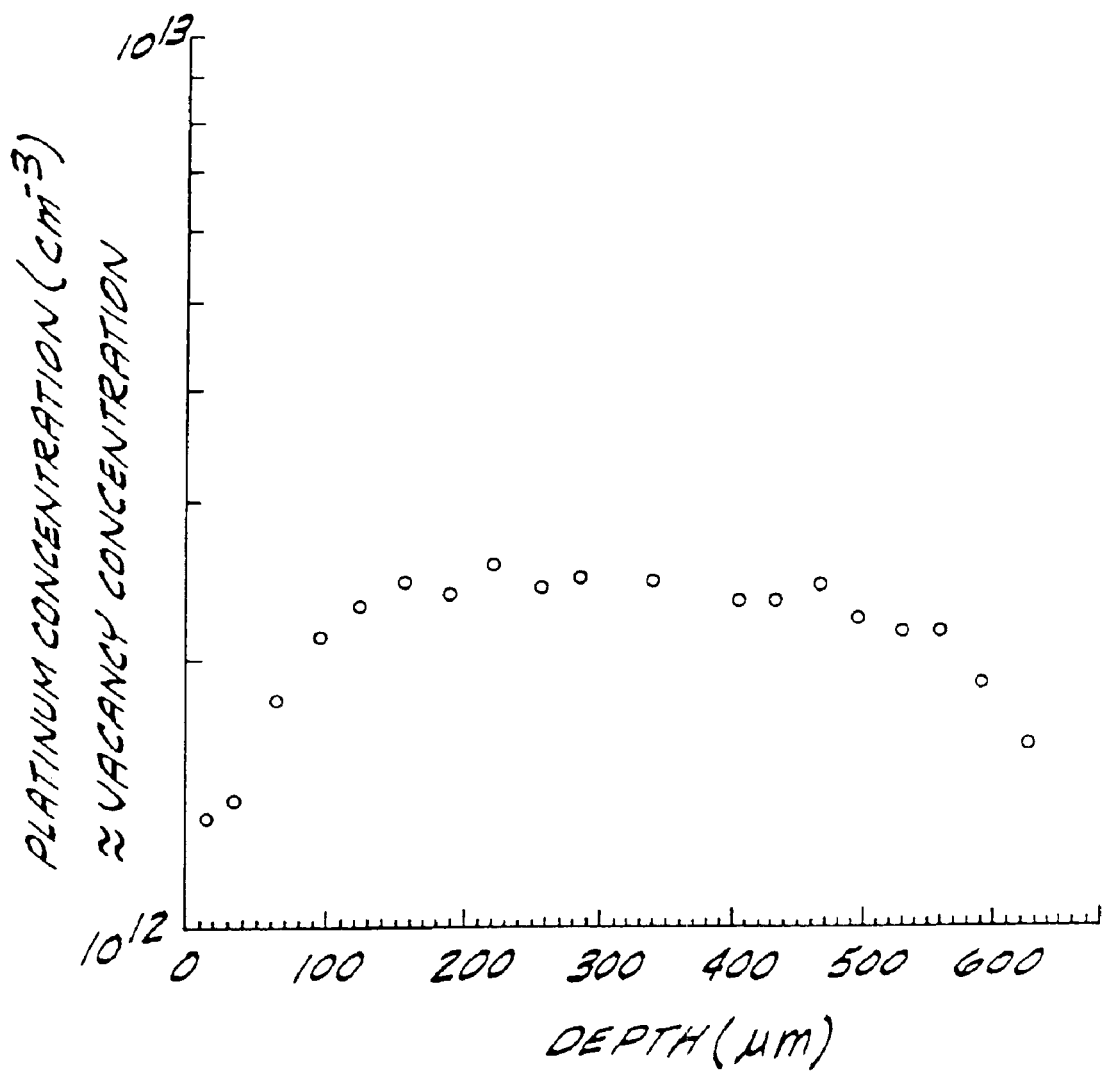
FIG. 10 is a graph of the log of platinum concentration (atoms/cm$^3$) versus depth from the surface of a wafer (sample 4–7) which was subjected to the series of steps set forth in Example 1.

In addition, the concentration of crystal lattice vacancies in the sample 4–7 was mapped using a platinum diffusion technique. A plot of platinum concentration versus depth from the surface of the wafer (a depth of 0 micrometers corresponding to the front side of the wafer) appears in FIG. 10.

Example 2

Figure 11:
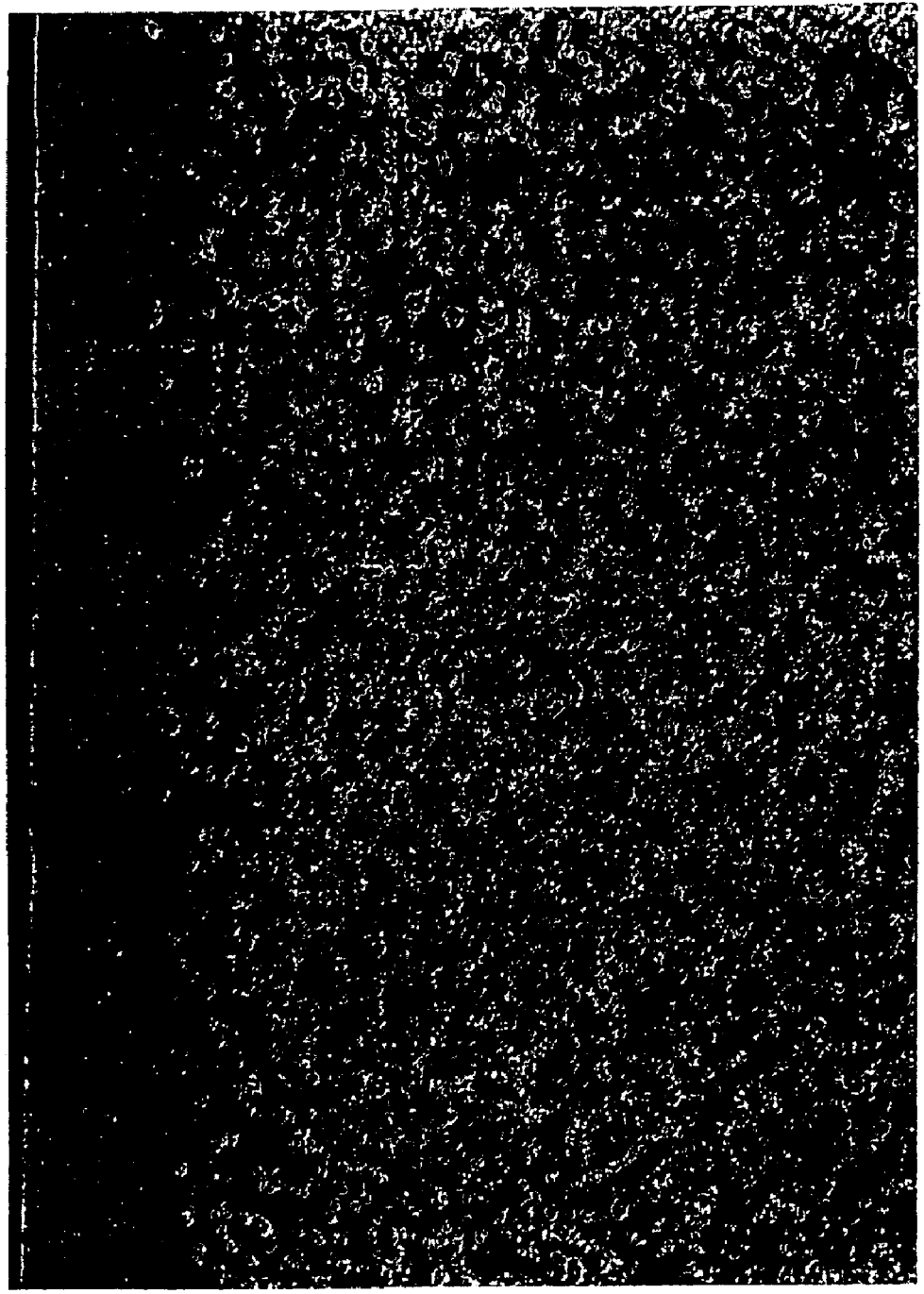
FIG. 11 is a photograph of a cross-section of a wafer (sample 3–4) which was subjected to the series of steps set forth in Example 2.
Figure 12:
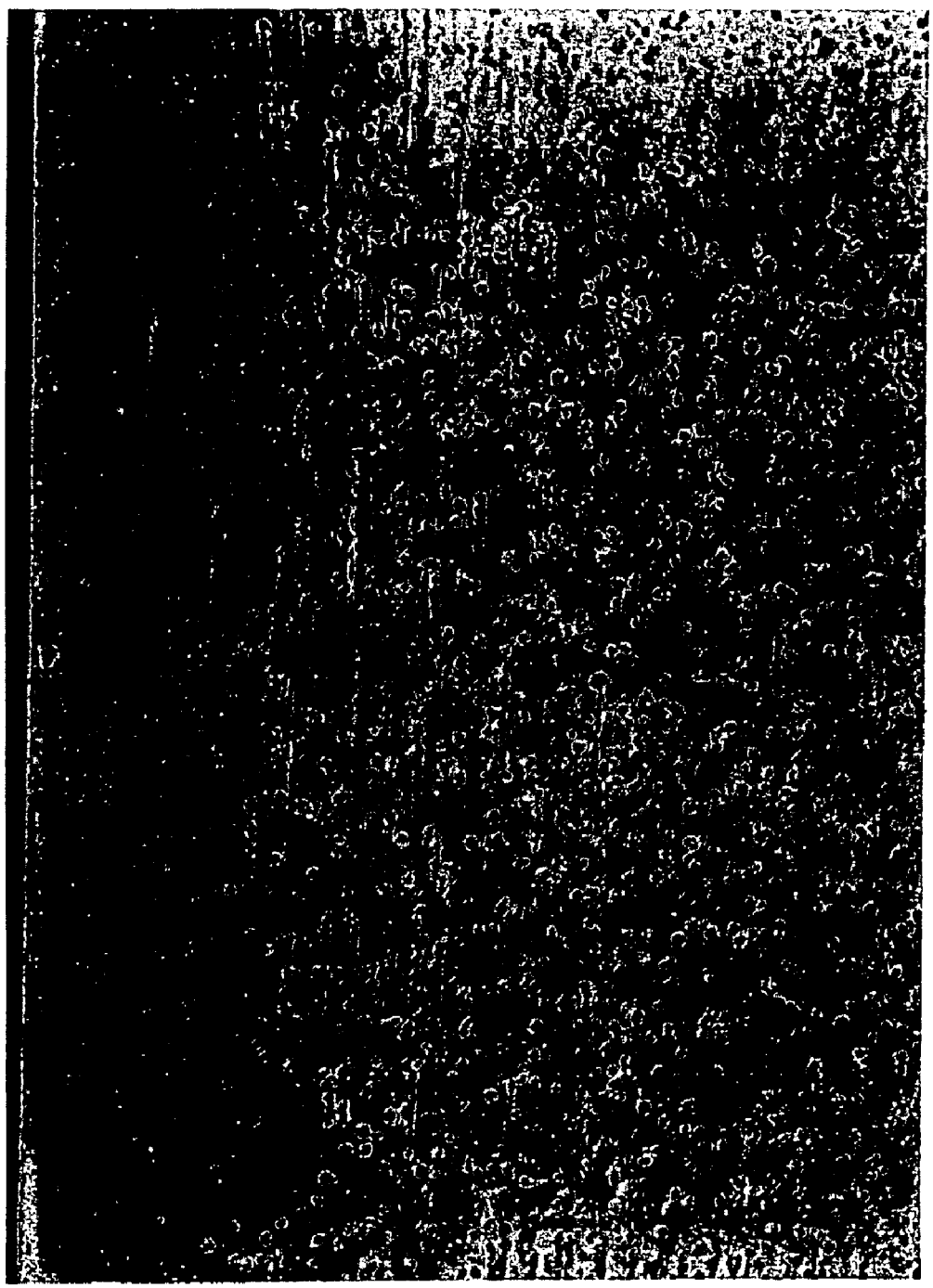
FIG. 12 is a photograph of a cross-section of a wafer (sample 3–5) which was subjected to the series of steps set forth in Example 2.
Figure 13:
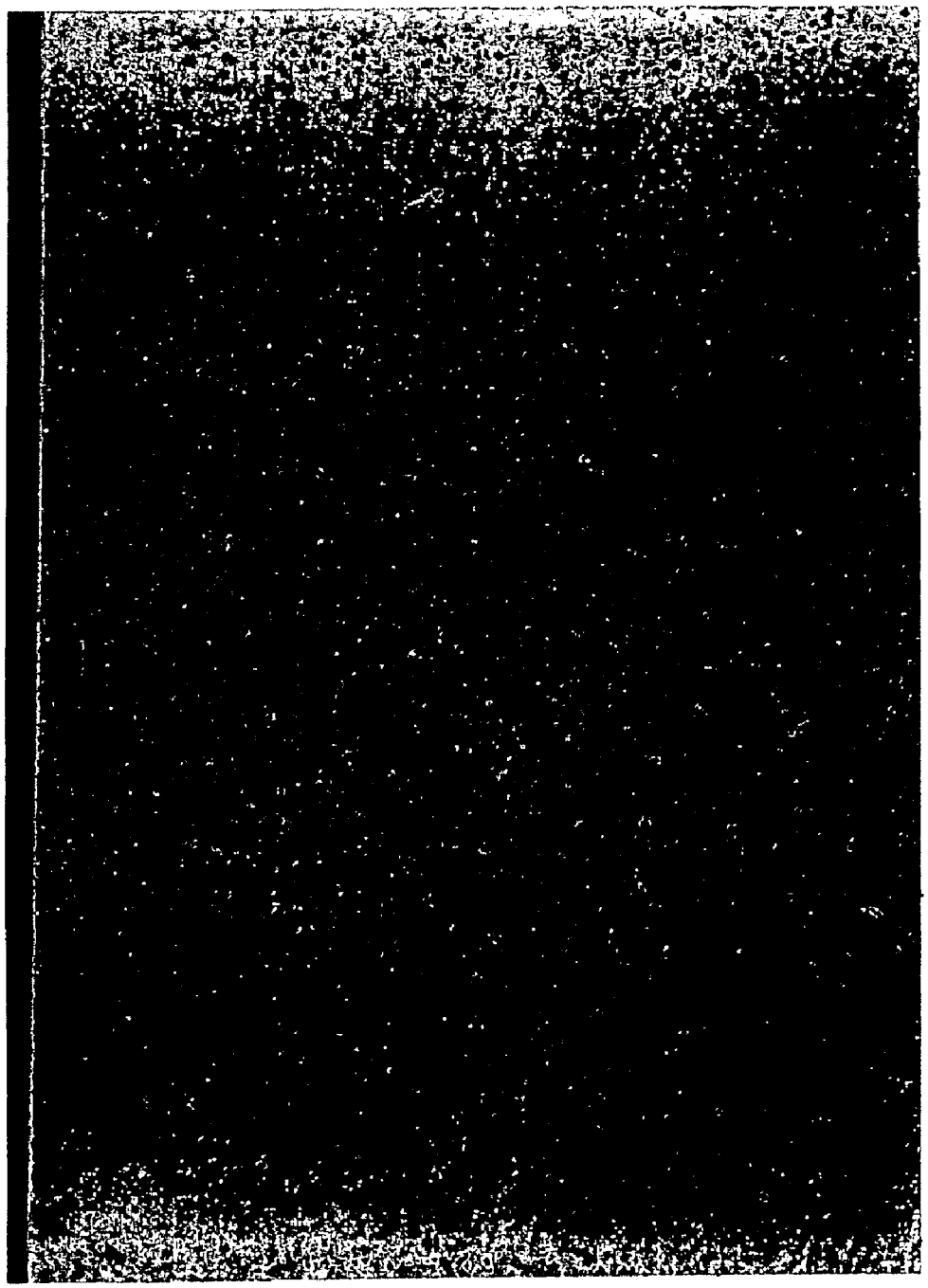
FIG. 13 is a photograph of a cross-section of a wafer (sample 3–6) which was subjected to the series of steps set forth in Example 2.

To demonstrate that the process of the present invention is relatively independent of oxygen concentration for Czochralski-grown silicon wafers, three wafers having different oxygen concentrations were subjected to the same series of steps described in Example 1. The conditions for each of these steps, the initial oxygen concentration of the wafers ($O_i$) before steps $S_1$–$S_4$, the oxygen precipitate density (OPD) in the bulk of the wafers after step $S_4$, and the depth of the precipitate-free or denuded zone (DZ) after step $S_4$ as measured from the surface of the wafer are reported in Table IV. FIGS. 11, 23, and 13 show cross-sections of the resulting wafers (these figures are enlargements of photographs taken at a magnification of 200×); sample 3–4 is shown in FIG. 11, sample 3–5 is shown in FIG. 12, and sample 3–6 is shown in FIG. 13.

TABLE IV

| Sample | 3–4 | 3–5 | 3–6 |
|---|---|---|---|
| $S_1$ | 15 min at 1,000° C. in $N_2$ + ~1% $O_2$ | 15 min at 1,000° C. in $N_2$ + ~1% $O_2$ | 15 min at 1,000° C. in $N_2$ + ~1% $O_2$ |
| $S_2$ | 35 seconds at 1250° C. in $N_2$ | 35 seconds at 1250° C. in $N_2$ | 35 seconds at 1250° C. in $N_2$ |
| $S_3$ | 125° C./sec | 125° C./sec | 125° C./sec |
| $S_4$ | 4 hr at 800° C. + 16 hr at 1,000° C. in $N_2$ | 4 hr at 800° C. + 16 hr at 1,000° C. in $N_2$ | 4 hr at 800° C. + 16 hr at 1,000° C. in $N_2$ |
| $O_i$ (atoms/cm$^3$) | $6 \times 10^{17}$ | $7 \times 10^{17}$ | $8 \times 10^{17}$ |
| OPD (atoms/cm$^3$) | $4 \times 10^{10}$ | $1 \times 10^{10}$ | $6 \times 10^{10}$ |
| DZ (depth in μm) | ~40 | ~40 | ~40 |

Example 3

Figure 14:
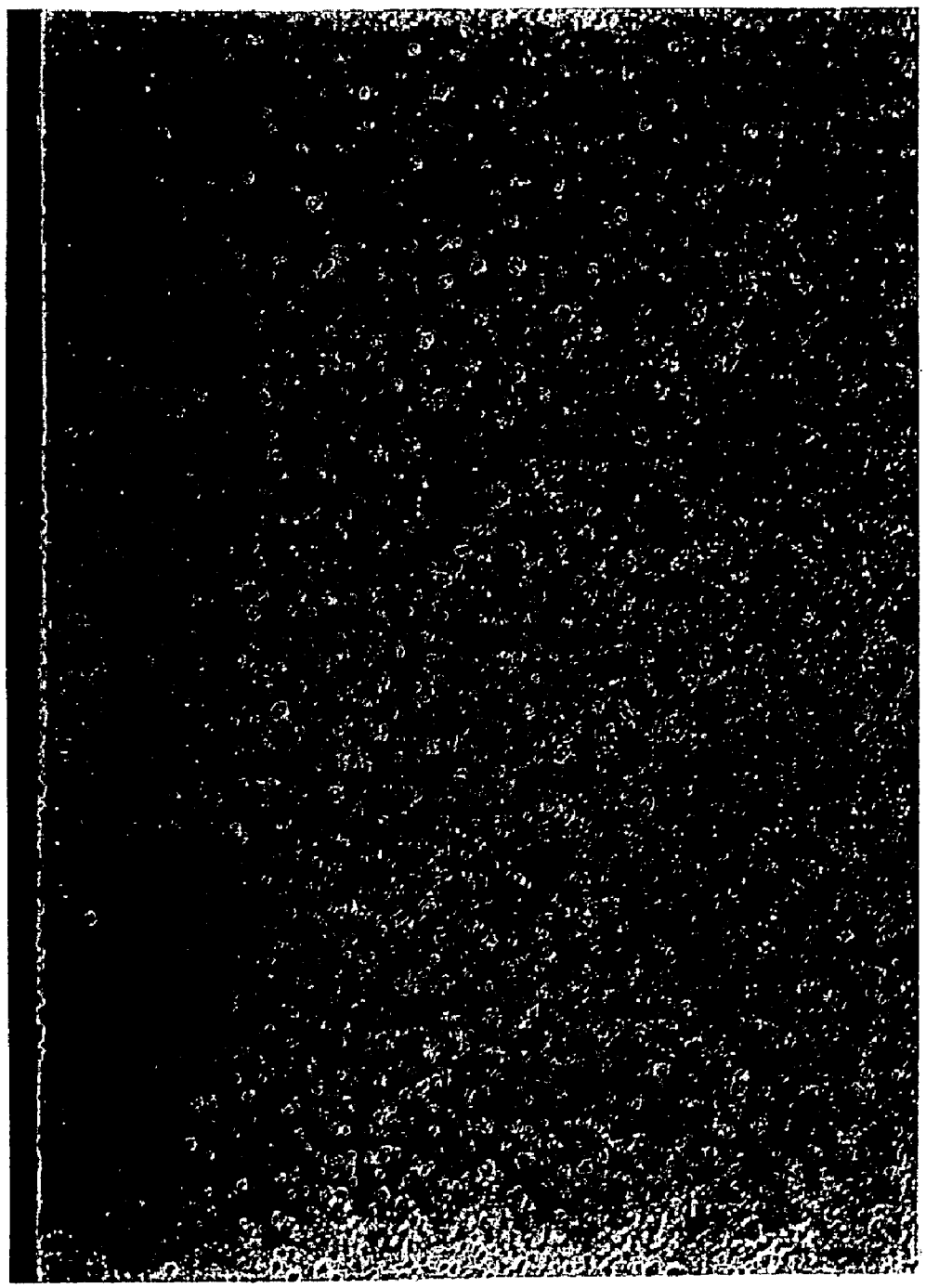
FIG. 14 is a photograph of a cross-section of a wafer (sample 1–8) which was subjected to the series of steps set forth in Example 3.

To demonstrate that the process of the present invention was relatively independent of the conditions used for the oxygen precipitate stabilization and growth step ($S_4$), a wafer (sample 1–8) having the same initial oxygen concentration was subjected to the same series of steps described in Example 2 for sample 3–4 except that a proprietary, commercial 16 Mb DRAM process was used as the oxygen precipitate stabilization and growth step ($S_4$). FIG. 14 shows a cross-section of the resulting wafer (this figure is an enlargement of a photograph taken at a magnification of 200×). After step $S_4$, samples 1–8 and 3–4 had comparable bulk oxygen precipitate densities ($7 \times 10^{10}$/cm$^3$ for sample 1–8 versus $4 \times 10^{10}$/cm$^3$ for sample 3–4) and comparable precipitate-free zone depths (approximately 40 micrometers).

Example 4

This example illustrates the trend that may be observed in the density of bulk microdefects (BMD), i.e., the density of oxygen precipitants, and the depth of the precipitate-free or denuded zone (DZ) resulting from an increase in the concentration of oxygen in the atmosphere during the heat-treatment. Three different sets of wafers were subjected to rapid thermal annealing under varying process conditions. The wafers in Set A were annealed at 1200° C. for 30 seconds under a nitrogen atmosphere; the wafers in Set B were annealed under the same conditions for 20 seconds; and, the wafers in Set C were annealed at 1200° C. for 30 seconds under an argon atmosphere. A pre-oxidation step was not performed on any of the wafers in the three sets in this Example.

As indicated by Table V, below, the oxygen partial pressure was increased for each wafer within a given Set. Once annealing was completed, the BMD density and DZ depth for each wafer was determined by means standard in the art. The results are present in Table V, below.

TABLE V

| Wafer Set | Oxygen Partial Pressure | BMD Density (defects/cm$^{-3}$) | DZ Depth (microns) |
|---|---|---|---|
| A | 250 ppma | $6.14 \times 10^9$ | 70 |
| A | 500 ppma | $6.24 \times 10^9$ | 80 |
| A | 1000 ppma | $2.97 \times 10^9$ | 80 |
| A | 2000 ppma | $7.02 \times 10^8$ | 100 |
| A | 5000 ppma | $2.99 \times 10^7$ | ND |
| A | $1 \times 10^6$ ppma | $6.03 \times 10^6$ | ND |
| B | 500 ppma | $2.59 \times 10^9$ | 80 |
| B | 1000 ppma | $1.72 \times 10^9$ | 100 |
| B | 2000 ppma | $9.15 \times 10^8$ | 100 |
| B | 5000 ppma | $2.65 \times 10^7$ | ND |
| B | $1 \times 10^6$ ppma | $2.17 \times 10^6$ | ND |
| C | 250 ppma | $2.65 \times 10^9$ | 90 |
| C | 500 ppma | $4.03 \times 10^9$ | 70 |
| C | 1000 ppma | $1.72 \times 10^9$ | 140 |
| C | 5000 ppma | $1.69 \times 10^8$ | 120 |

ND = not determined

The above data shows that as the partial pressure of oxygen in the atmosphere increases, the number density of bulk microdefects decreases. In addition, when the oxygen partial pressure reaches 10,000 ppma, the number density of bulk microdefects is indistinguishable from the number density of bulk microdefects which is observed in wafers which have been subjected to an oxygen precipitation heat-treatment without a prior rapid thermal annealing in accordance with the present invention.

In view of the above, it will be seen that the several objects of the invention are achieved. As various changes could be made in the above compositions and processes without departing from the scope of the invention, it is intended that all matter contained in the above description be interpreted as illustrative and not in a limiting sense.

What is claimed is:

1. A silicon on insulator structure comprising a device layer, a supporting layer and a dielectric layer therebetween, wherein the device layer comprises an epitaxial layer and the supporting layer comprises
   (i) a first region and a second region, the first region extending from the dielectric layer to the second region and having a thickness, T, as measured from the dielectric layer to the second region, and
   (ii) a non-uniform concentration of crystal lattice vacancies, the concentration of the vacancies in the second region being greater than the concentration of vacancies in the first region.

2. The silicon on insulator structure of claim 1 wherein the supporting layer, upon being subjected to an oxygen precipitation heat treatment consisting essentially of annealing the silicon on insulator structure at 800° C. for four hours and then at 1000° C. for sixteen hours, contains oxygen precipitates having a concentration profile in which a peak density of the precipitates is in the second region at or near a central plane with the concentration of the precipitates in the second region generally decreasing in the direction of the first region.

3. The silicon on insulator structure of claim 1 wherein the first region has a thickness of at least about 5 microns.

4. The silicon on insulator structure of claim 1 wherein the first region has a thickness of at least about 10 microns.

5. The silicon on insulator structure of claim 1 wherein the first region has a thickness of at least about 20 microns.

6. The silicon on insulator structure of claim 1 wherein the first region has a thickness of at least about 50 microns.

7. The silicon on insulator structure of claim 1 wherein the epitaxial layer has a thickness within the range of at least about 0.1 $\mu$m to less than about 2 $\mu$m.

8. The silicon on insulator structure of claim 1 wherein the epitaxial layer has a thickness within the range of about 0.25 to about 1 $\mu$m.

9. The silicon on insulator structure of claim 1 wherein the supporting layer has a carbon concentration which is less than about $1 \times 10^{16}$ atoms/cm$^3$.

10. A silicon on insulator structure comprising a device layer, a supporting layer and a dielectric layer therebetween, wherein the device layer comprises an epitaxial layer and the supporting layer comprises
    (i) a first region and a second region, the first region extending from the dielectric layer to the second region and having a thickness, T, as measured from the dielectric layer to the second region, and
    (ii) a non-uniform depth distribution of stabilized oxygen precipitates, the concentration of the precipitates in the second region being greater than the concentration of precipitate in the first region.

11. The silicon on insulator structure of claim 10 wherein the supporting layer has a stabilized oxygen precipitate concentration profile in which a peak density of the precipitates is in the second region at or near a central plane with the concentration of the precipitates in the second region generally decreasing in the direction of the first region.

12. The silicon on insulator structure of claim 10 wherein the first region has a thickness of at least about 5 microns.

13. The silicon on insulator structure of claim 10 wherein the first region has a thickness of at least about 10 microns.

14. The silicon on insulator structure of claim 10 wherein the first region has a thickness of at least about 20 microns.

15. The silicon on insulator structure of claim 10 wherein the first region has a thickness of at least about 50 microns.

16. The silicon on insulator structure of claim 10 wherein the first region has a thickness ranging from about 5 microns to less than about 100 microns.

17. The silicon on insulator structure of claim 10 wherein the epitaxial layer has a thickness within the range of at least about 0.1 $\mu$m to less than about 2 $\mu$m.

18. The silicon on insulator structure of claim 10 wherein the epitaxial layer has a thickness within the range of about 0.25 to about 1 $\mu$m.

19. The silicon on insulator structure of claim 10 wherein the supporting layer has a carbon concentration which is less than about $1 \times 10^{16}$ atoms/cm$^3$.

20. The silicon on insulator structure of claim 10 wherein the oxygen precipitates have an average cross-sectional area of at least about 40 nm.

21. The silicon on insulator structure of claim 10 wherein the oxygen precipitates have an average cross-sectional area of at least about 50 nm.

22. The silicon on insulator structure of claim 10 wherein the oxygen precipitates have an average cross-sectional area of at least about 60 nm.

23. The silicon on insulator structure of claim 10 wherein the oxygen concentration of the supporting layer is at least about $6 \times 10^{17}$ atoms/cm$^3$.

24. A silicon on insulator structure comprising a device layer, a supporting layer and a dielectric layer therebetween, wherein the device layer comprises an epitaxial layer and the supporting layer comprises
    (i) a first region and a second region, the first region extending from the dielectric layer to the second region and having a thickness, T, as measured from the dielectric layer to the second region, and (ii) a non-uniform depth distribution of secondary defects capable of acting as intrinsic gettering sites, the concentration of defects in the second region being greater than the concentration of defects in the first region.

25. The silicon on insulator structure of claim 24 wherein the supporting layer has a secondary defect concentration profile in which a peak density of the defects is in the second region at or near a central plane with the concentration of the defects in the second region generally decreasing in the direction of the first region.

26. The silicon on insulator structure of claim 24 wherein the first region has a thickness of at least about 5 microns.

27. The silicon on insulator structure of claim 24 wherein the first region has a thickness of at least about 10 microns.

28. The silicon on insulator structure of claim 24 wherein the first region has a thickness of at least about 20 microns.

29. The silicon on insulator structure of claim 24 wherein the first region has a thickness ranging from about 5 microns to less than about 100 microns.

30. The silicon on insulator structure of claim 24 wherein the epitaxial layer has a thickness within the range of at least about 0.1 μm to less than about 2 μm.

31. The silicon on insulator structure of claim 24 wherein the epitaxial layer has a thickness within the range of about 0.25 to about 1 μm.

32. The silicon on insulator structure of claim 24 wherein the supporting layer has a carbon concentration which is less than about $1 \times 10^{16}$ atoms/cm$^3$.

33. The silicon on insulator structure of claim 24 wherein the oxygen concentration of the supporting layer is at least about $6 \times 10^{17}$ atoms/cm$^3$.

34. The silicon on insulator structure of claim 24 wherein the secondary defects are prismatic dislocation loops or tangles, or stacking faults.

* * * * *